(12) United States Patent
Arai et al.

(10) Patent No.: US 6,680,230 B2
(45) Date of Patent: Jan. 20, 2004

(54) SEMICONDUCTOR DEVICE AND METHOD OF FABRICATING THE SAME

(75) Inventors: Norihisa Arai, Saitama (JP); Fumitaka Arai, Yokohama (JP); Seiichi Aritome, Yokohama (JP); Akira Shimizu, Yokohama (JP); Riichiro Shirota, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/201,111

(22) Filed: Jul. 24, 2002

(65) Prior Publication Data

US 2003/0020119 A1 Jan. 30, 2003

(30) Foreign Application Priority Data

Jul. 25, 2001 (JP) ........................................ 2001-225027
Jul. 30, 2001 (JP) ........................................ 2001-229409

(51) Int. Cl.[7] .................. H01L 21/336; H01L 21/8234; H01L 21/8244
(52) U.S. Cl. .................. 438/258; 438/261; 438/238
(58) Field of Search ................. 438/238, 239, 438/244, 258, 261, 266, 275, 981

(56) References Cited

U.S. PATENT DOCUMENTS

| 6,429,073 B1 | * | 8/2002 | Furuhata et al. | ............ 438/258 |
| 6,522,587 B1 | * | 2/2003 | Furuhata et al. | ............ 257/390 |
| 6,537,869 B1 | * | 3/2003 | Furuhata | .................... 438/239 |
| 6,570,788 B1 | * | 5/2003 | Nakamura | ............ 365/185.18 |

FOREIGN PATENT DOCUMENTS

JP          8-21636          3/1996

* cited by examiner

*Primary Examiner*—John F. Niebling
*Assistant Examiner*—Walker L. Lindsay, Jr.
(74) *Attorney, Agent, or Firm*—Oblon, Spivak, McClelland, Maier & Neustadt, P.C.

(57) ABSTRACT

A method of fabricating a semiconductor device which has a cell array with non-volatile memory transistors and a peripheral circuit including a first transistor and a second transistor as driven by a lower voltage than the first transistor is disclosed. The method includes the steps of forming over a semiconductor substrate a first gate dielectric film for use in the first transistor, selectively etching the first gate dielectric film in the cell array region to expose the substrate, forming over the exposed substrate a second gate dielectric film which is for use as a tunnel dielectric film of the memory transistors, forming a first gate electrode material film over the first and second gate dielectric films, selectively etching the first gate electrode material film and its underlying first gate dielectric film in the second transistor region, forming over the exposed substrate a third gate dielectric film which is for use in the second transistor, forming a second gate electrode material film over the third gate dielectric film, and forming gates of the respective transistors while letting the gates at least partly include the first and second gate electrode material films.

19 Claims, 26 Drawing Sheets

[CELL ARRAY]

[CELL ARRAY]

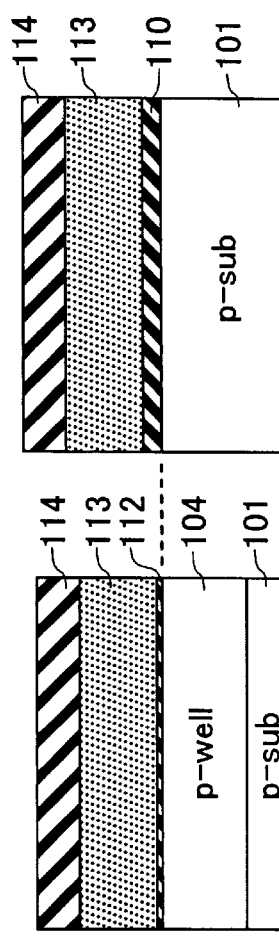
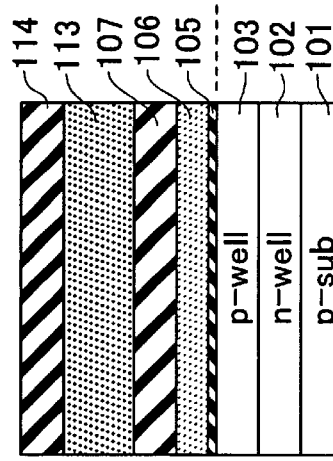
FIG. 28
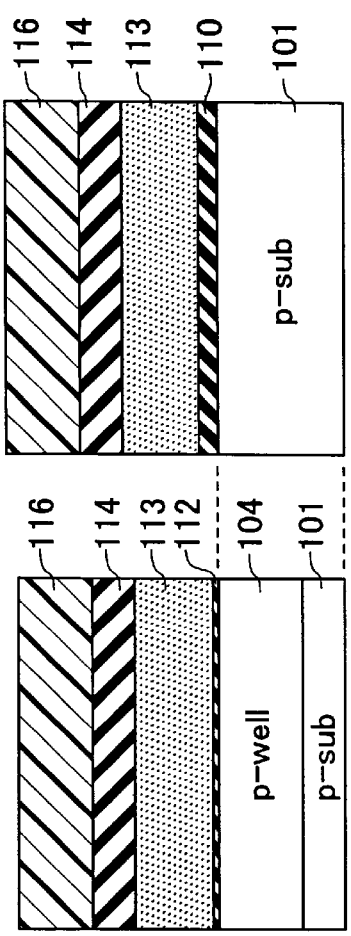
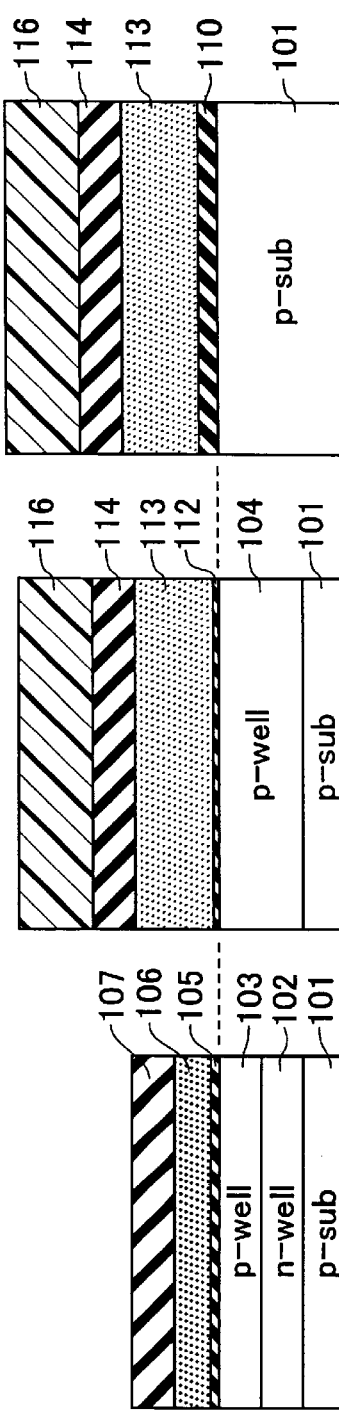
FIG. 29

SEMICONDUCTOR DEVICE AND METHOD OF FABRICATING THE SAME

CROSS-REFERENCE TO RELATED APPLICATIONS

This application is based on and claims the benefit of priority from prior Japanese Patent Applications No. 2001-225027, filed on Jul. 25, 2001 and No. 2001-229409, filed Jul. 30, 2001, the entire contents of which are incorporated herein by reference.

BACKGROUND OF THE INVENTION

1. Field of the Invention

This invention relates generally to semiconductor devices with a plurality of types of transistors integrated together and, more particularly, to methodology of fabricating a semiconductor device including an array of non-volatile memory cells formed of transistors, also known as "memory transistors."

2. Description of the Related Art

Nonvolatile semiconductor memory devices including but not limited to "flash" electrically erasable programmable read only memory (EEPROM) chips of the NAND cell type are typically designed to employ memory transistors with metal insulator semiconductor field effect transistor (MISFET) structures. These memory transistors each have a lamination or multilayer structure of an electrically isolated gate, typically termed "floating" gate, for use as a charge storage layer and a control gate over a semiconductive chip substrate. A dielectric insulating film for use as a gate insulator (gate insulator film) is interposed between the floating gate and the substrate. This gate insulator film is formed of a tunnel dielectric film with a thickness of approximately 8 nanometers (nm) in light of carrier injection and release (charge and discharge) between the substrate and the floating gate and also the data retaining characteristics required.

On the other hand, peripheral circuitry for performing data write/erase/read control of a cell array includes high voltage-driven transistors to which a potentially increased or "raised" voltage directly relating to write and erase operations is given and low voltage-driven transistors operable with a power supply voltage. The high voltage transistors make use of a gate insulator film as thin as about 35 nm to provide enhanced durability against high voltages applied thereto. The low voltage transistors use a thinner gate insulator film.

These three kinds of gate insulator films—that is, the tunnel dielectric, high voltage transistor gate insulator, and low voltage transistor gate insulator films—are obtainable for example by a process which follows. Firstly, form by thermal oxidation a gate oxide film with a thickness of 3 nm in a cell array region of a silicon substrate. Then, let the substrate surface be exposed at its selected portion in a high voltage transistor region. Next, perform thermal oxidation again to thereby form a gate oxide film which is about 30 nm thick. Subsequently, expose a surface portion of the substrate in a low voltage transistor region and then perform thermal oxidation, thereby forming a gate oxide film of about 5 nm thickness. Through repeated effectuation of thermal oxidation processes, a gate oxide film of about 8 nm thick is finally obtained in the cell array region, with a gate oxide film of about 35 nm thick being formed in the high voltage transistor region.

However, such method for sequentially forming the gate oxide films in the respective circuit regions is under strict and severe requirements for film thickness controllability. In particular, the tunnel dielectric film for use in memory transistors is sensitive to even a small mount of slight film thickness variation in view of the fact that this film directly affects the data write/erase/retain characteristics. This makes it difficult to obtain higher production yields and increased reliability.

Additionally, it is also important for the memory transistor tunnel dielectric film to offer superior film quality other than the accurate thickness controllability. It has been traditionally known among those skilled in the semiconductor device art that film quality degradation occurs due to some causes, one of which is contamination from resist masks. With the method having the steps of forming an oxide film for later use as the tunnel dielectric film of the cell array region, directly forming on its surface a resist mask, and then etching a portion of the tunnel dielectric film of peripheral circuitry to thereby expose its corresponding substrate surface, it is impossible to obtain any intended tunnel dielectric film of high quality.

Methods for precluding resist contamination of the tunnel dielectric film of the cell array have been proposed until today, one of which is disclosed, for example, in Japanese Patent Publication (Kokoku) No. 8-21636. With this method as taught thereby, immediately after having formed a desired tunnel dielectric film in the cell array region, deposit thereon a polycrystalline silicon or "poly-silicon" film for later use as portions of gate electrodes. Then, form a resist mask pattern having an opening in a peripheral circuit region. Next, remove by etching the polysilicon film and its underlying gate insulator film, thus forming a gate insulator film of the peripheral circuitry.

If the gate insulator films for use in high-voltage and low-voltage transistors of the peripheral circuitry are formed sequentially while letting the cell array region's tunnel dielectric film be covered with the polysilicon film in this way, then the tunnel dielectric is no longer contaminated while guaranteeing that no appreciable film thickness changes take place even during thermal oxidation processes to be later performed. This enables achievement of good thickness controllability and improved film quality.

Unfortunately, even the method of making the gate insulator film of peripheral circuitry while letting the tunnel dielectric film be covered or coated with the polysilicon film is encountered with problems that follow. A first problem is that even in the state that a polysilicon film is formed for use as part of floating gates, memory transistors can decrease in reliability if its following thermal processing is done at high temperatures for an increased length of time period. FIG. 20 shows a typical pattern of threshold voltage variation or change as measured when a memory transistor is repeatedly subject to write and erase cycles.

As shown in FIG. 20, in regard to both the write state (i.e. electron is injected to a floating gate resulting in a threshold voltage being made higher) and the erase state (the stored electron is released out of the floating gate resulting in the threshold voltage being lowered), the threshold voltage tends to potentially rise up with an increase in write/erase cycle number. When compared to the case (indicated by solid lines in FIG. 20) where thermal processing after floating gate formation is carried out at relatively low temperatures for a shortened time period, the tendency becomes more significant when the thermal process is done at higher temperature for a longer time period (indicated by dotted lines). As a example, successful fabrication of a 30-nm thick gate insulator film for use in high voltage transistors requires thermal oxidation at 1150° C. for 200 seconds, or more or less. This would result in a decrease in reliability of the memory transistors which are covered by the polysilicon film.

A second problem faced with the above-noted prior known method lies in occurrence of re-diffusion of doped impurity due to thermal processing. More specifically, when doping impurity ions into the cell array region for transistor threshold voltage adjustment purposes prior to formation of the gate insulator film of the peripheral circuitry, in particular, during the high-temperature/long-time thermal oxidation process for forming the gate oxide film of high voltage transistors, rediffusion of doped impurity can take place. This disables achievement of any desired impurity concentration profile in the cell array region. Especially in the cell array with a layout of micropatterned ultra-fine memory transistors, it is desired to accurately control the carrier concentration profile of an impurity doped in transistor channel in order to reduce the so-called "short channel" effects and back-bias effects.

Another problem faced with the EEPROM fabrication process is as follows. Currently available NAND-EEPROM fabrication processes include the one which has the steps of (i) burying and forming an element isolating dielectric film by using shallow trench isolation (STI) technologies after having formed a first gate electrode martial film for later use as part of floating gates of memory transistors and also as part of gates of peripheral circuit transistors, (ii) depositing a second gate electrode material film on the first gate electrode material film, (iii) forming slits in the second gate electrode material film in a cell array region, each of which is for separation between the floating gates, (iv) sequentially depositing a gate-to-gate isolation or "inter-gate" dielectric film and a third gate electrode material film for use as control gates of the memory transistors, and (v) selectively etching the first to third gate electrode material films to form gates of the memory transistors and of the peripheral circuit transistors.

In this process, at the element isolation step, the first gate electrode material film is covered by a stopper film, which will later be removed away after the element isolation dielectric film is buried. Due to this, the second gate electrode material film is formed in such a state that the element isolation dielectric film is projected. Recall here that the cell array region is such that the memory transistors are laid out with a greater integration density than that in the peripheral circuitry; thus, the cell array region is inherently less in width of element formation region than the peripheral circuit region. The result of this is that the third gate electrode material film is formed so that its thickness in the cell array region is greater than that in the peripheral circuit region. This is because element formation regions exhibit recess portions at ultrafine intervals or pitches in the cell array region. In this case, if, at a later process step of patterning all the gates of respective transistors at a time, any required sufficient etching time is taken for the cell array, then over-etching would occur in the peripheral circuit region. Adversely, if the sufficient etching required is done in the peripheral circuit region then etch-failed portions can occur in the cell array region. As stated previously, both the high voltage transistors having a thick gate insulator film and the low voltage transistors with a thin gate insulator film are formed in the peripheral circuitry. In particular in the region of such low voltage transistors, if the above-noted overetching is present then the substrate per se is readily etched unwantedly. This makes it difficult to obtain any low voltage transistors of excellent characteristics.

SUMMARY OF THE INVENTION

A method of fabricating a semiconductor device having a cell array with a layout of non-volatile memory transistors and a peripheral circuit including a first transistor and a second transistor driven by a lower voltage than the first transistor, includes forming over a semiconductor substrate a first gate dielectric film for use in the first transistor, selectively etching the first gate dielectric film in a region of the cell array to expose the semiconductor substrate, forming over the semiconductor substrate thus exposed a second gate dielectric film for use as a tunnel dielectric film of the memory transistors, the second gate dielectric film being thinner than the first gate dielectric film, forming a first gate electrode material film over the first and second gate dielectric films, selectively etching the first gate electrode material film and the first gate dielectric film thereunder in a region of the second transistor to expose the semiconductor substrate, forming over the semiconductor substrate thus exposed a third gate dielectric film for use in the second transistor, the third gate dielectric film being thinner than the second gate dielectric film, forming a second gate electrode material film over the third gate dielectric film, and forming gates of the first and second transistors and of the memory transistors while letting the gates at least partly include the first and second gate electrode material films.

BRIEF DESCRIPTION OF THE DRAWINGS

FIG. 28 is a sectional diagram showing a step of depositing a second polysilicon film and a stopper film in the embodiment.

FIG. 29 is a sectional diagram showing a step of etching the second polysilicon film of a cell array region in the embodiment.

DETAILED DESCRIPTION OF THE EMBODIMENTS

Embodiment 1

FIGS. 1 through 10 show a fabrication process of an embodiment of this invention which is applied to an EEPROM device of the NAND cell type, in the form of cross-section of its three major parts: a cell array region depicted on the right side of each drawing, a high voltage transistor field effect transistor (HV-FET) region in the middle, and a low voltage FET (LV-FET) region on the left. The HV-FET and LV-FET regions are of peripheral circuitry of the NAND-EEPROM.

Figure 1:
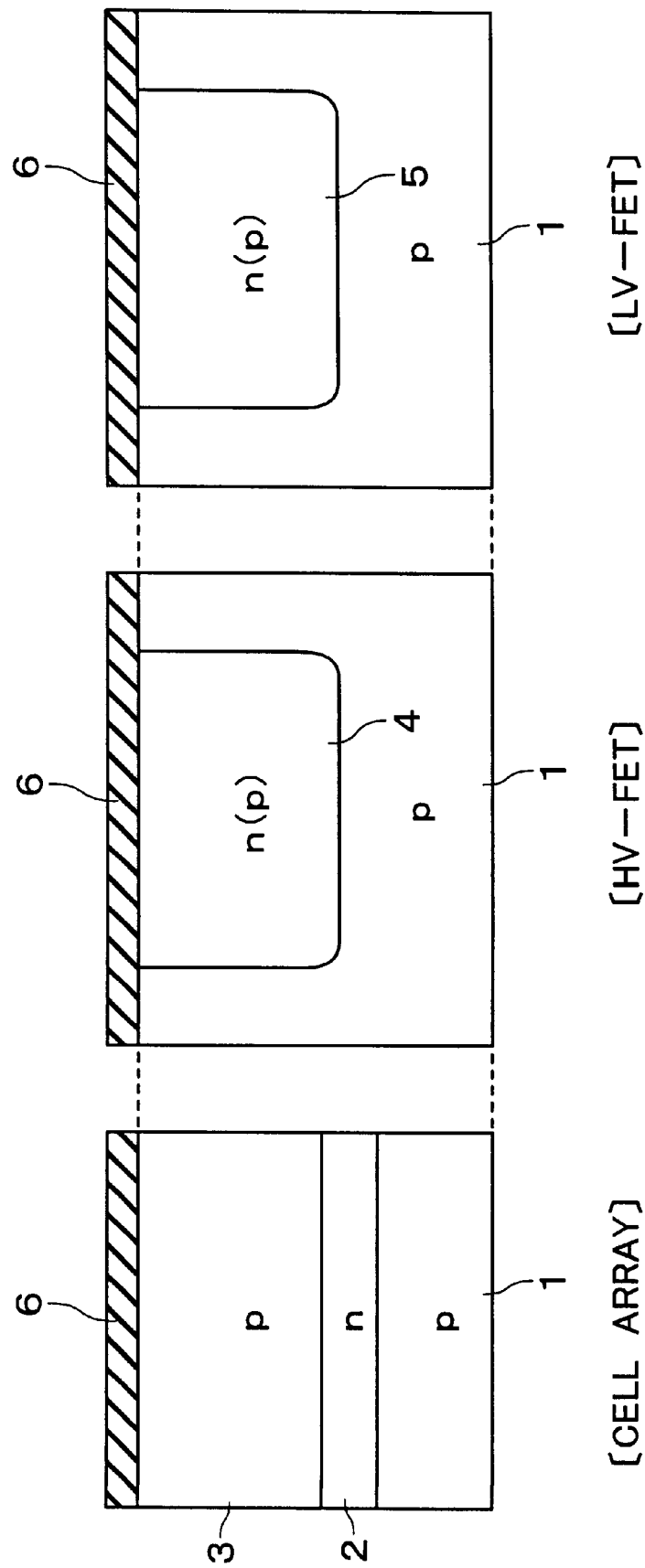
FIG. 1 is a cross-sectional diagram showing a process step of forming the gate oxide film of a high voltage transistor in accordance with an embodiment of this invention.

FIG. 1 illustrates, in cross-section, a p-type silicon substrate 1 in which semiconductor well layers 2, 3, 4, 5 of respective circuit regions are formed with a gate oxide film 6 for use in HV-FETs being formed thereafter on an entire surface area of substrate 1. The wells 2–4 are formed by ion implantation into each circuit region in the state that a sacrificial oxide film (not shown) is formed. In an entire area of the cell array, n-type well 2 is formed, in which p-type well 3 is formed. In case the peripheral circuitry is a complementary metal oxide semiconductor (CMOS) circuit, a p-type well is formed in an n-channel region whereas an n-type well is in p-channel region. Although in FIG. 1 a single transistor region is representatively shown with respect to each of the HV-FET and LV-FET regions, the wells 4, 5 are designed to have n type or p type in accordance with the channel conductivity type. Additionally, wells 4–5 are set at optimal values of impurity concentration and depth, although a detailed explanation thereof will be omitted herein.

It should be noted that the well formation is not always required for both the n-channel region and the p-channel region: in some cases, one of them may lack it and make direct use of "raw" substrate material. Similarly, in regard to the cell array also, it is not always necessary to form a dual or "double" well structure consisting of n- and p-type wells in the p-type substrate—in some cases, the p-type substrate may be utilized directly as the cell array region.

In the HV-FET region, after having formed the well 4, channel ion implantation for threshold voltage adjustment purposes is carried out through an appropriate sacrificial oxide film.

Then, the sacrificial oxide film used during well formation is removed away. Next, thermal oxidation is done at 1150° C. for 200 seconds to thereby newly form a gate oxide film 6 to a thickness of approximately 30 nanometers (nm).

Figure 2:
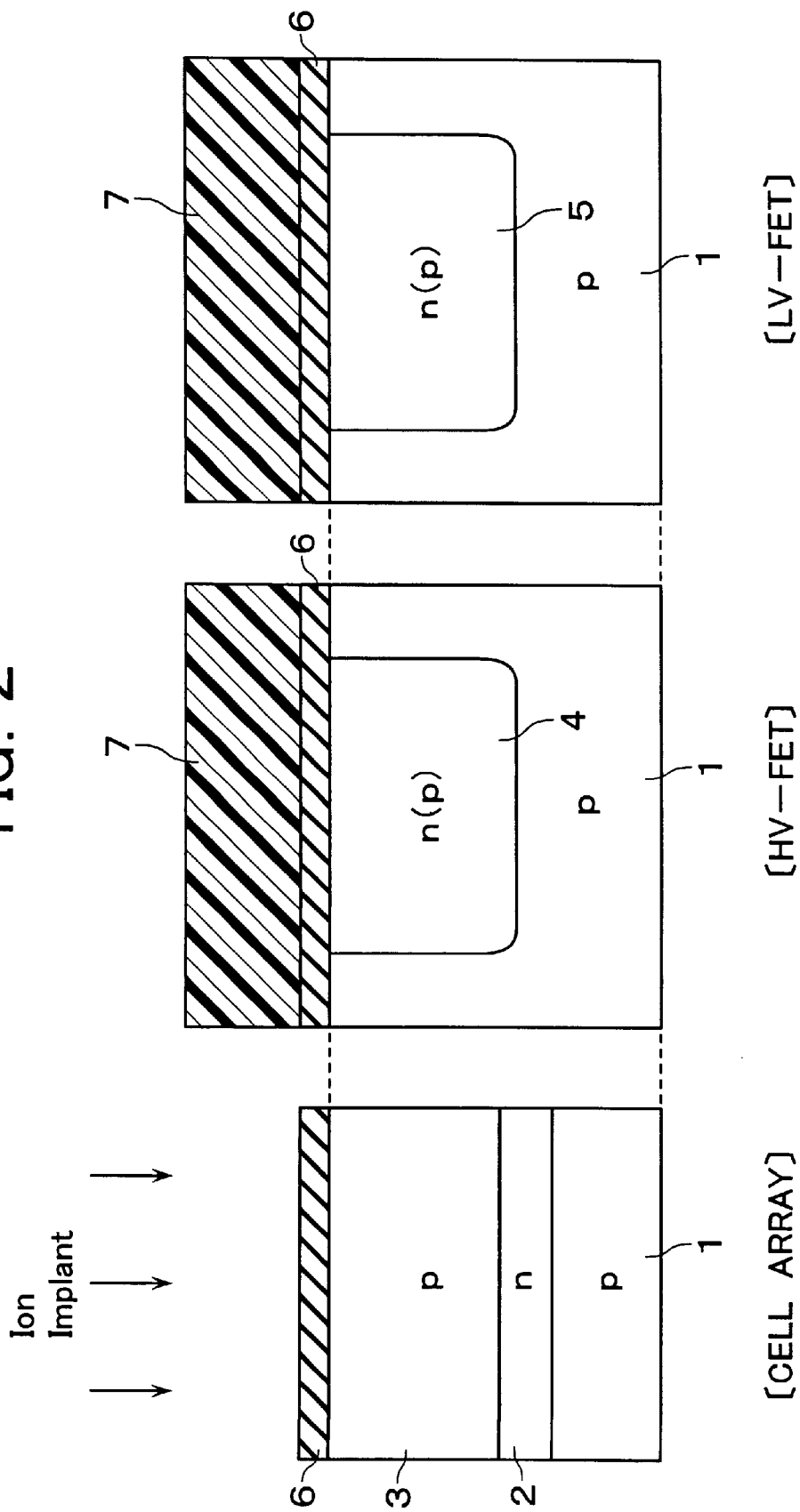
FIG. 2 is a sectional diagram showing a resist step for removal of a gate oxide film in a cell array region in accordance with the embodiment of the invention.

Next, perform a lithography process to cover a region of the peripheral circuit with a patterned resist mask 7 as shown in FIG. 2, for removing by etching a portion of the gate oxide film 6 in the cell array region. At this time, it is preferable that prior to etch away of the gate oxide film 6, channel ion implantation is done through gate oxide film 6 for adjustment of threshold voltage values of those transistors for use as memory cells, called "memory cell transistors" or more simply "memory transistors." As high-temperature/long-time thermal processing required to form the HV-FET's gate oxide film 6 has been completed, any later re-diffusion of the doped impurity in the cell array region is precluded successfully. This makes it possible to resultant ultrafine memory transistors to offer enhanced performance.

Optionally, not exclusively for the channel ion implant of the cell array region, the p-type well 3 and n-type well 2 of the cell array region may also be formed through ion implantation at this stage of the fabrication process. Whereby, well impurity rediffusion is suppressed while eliminating the need for any extra lithography for well formation, resulting in simplification of the process.

Figure 3:
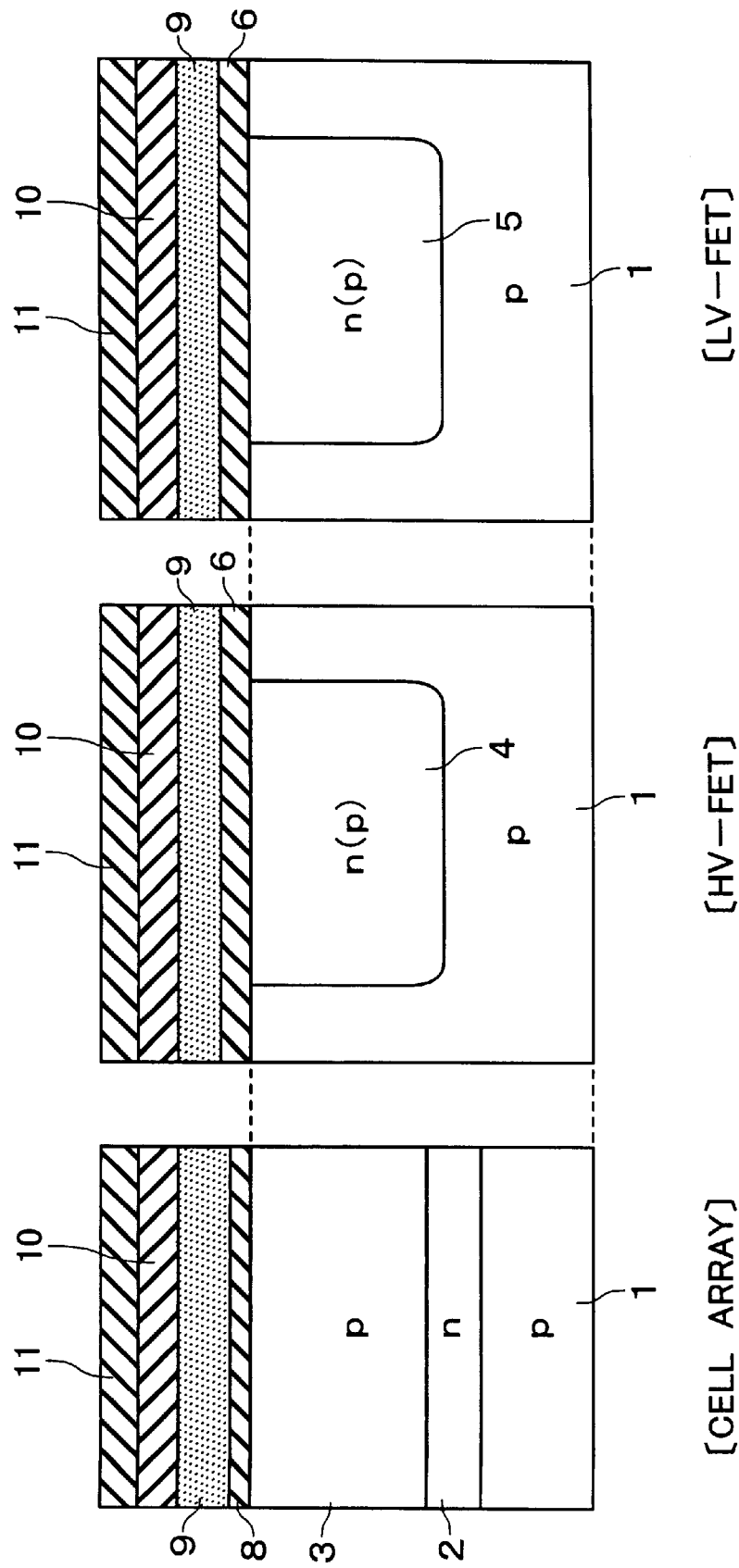
FIG. 3 is a sectional diagram showing a step of forming a gate oxide film of the cell array of the embodiment and its following step of forming a polysilicon film and a silicon nitride film plus a silicon oxide film.

Then, etch away the gate oxide film 6 in the cell array region and also remove the resist mask 7. Thereafter, as shown in FIG. 3, form in the cell array region of the substrate a gate oxide film (tunnel dielectric film) 8 that is thinner than the gate oxide film 6. Practically, the tunnel oxide film 8 is formed as a silicon oxide film with a thickness of 8 nm by thermal oxidation at 1050° C. for 80 sec. At this process step, the preformed gate oxide film 6 becomes about 35 nm in film thickness.

Subsequently as shown in FIG. 3, low pressure chemical vapor deposition (LPCVD) is performed to sequentially deposit a polycrystalline silicon (poly-silicon) film 9 with a thickness of about 40 nm for use as a gate electrode material film, a silicon nitride film 10 of about 40-nm thickness, and a silicon oxide film 11 which is about 40-nm thick. The polysilicon film 9 is the one that will become part of floating gates of the memory transistors and also becomes part of gate electrodes of peripheral circuit transistors. The silicon nitride film 10 will be used as a stopper film during burying of a dielectric film(s) at a later element isolation process.

Figure 4:
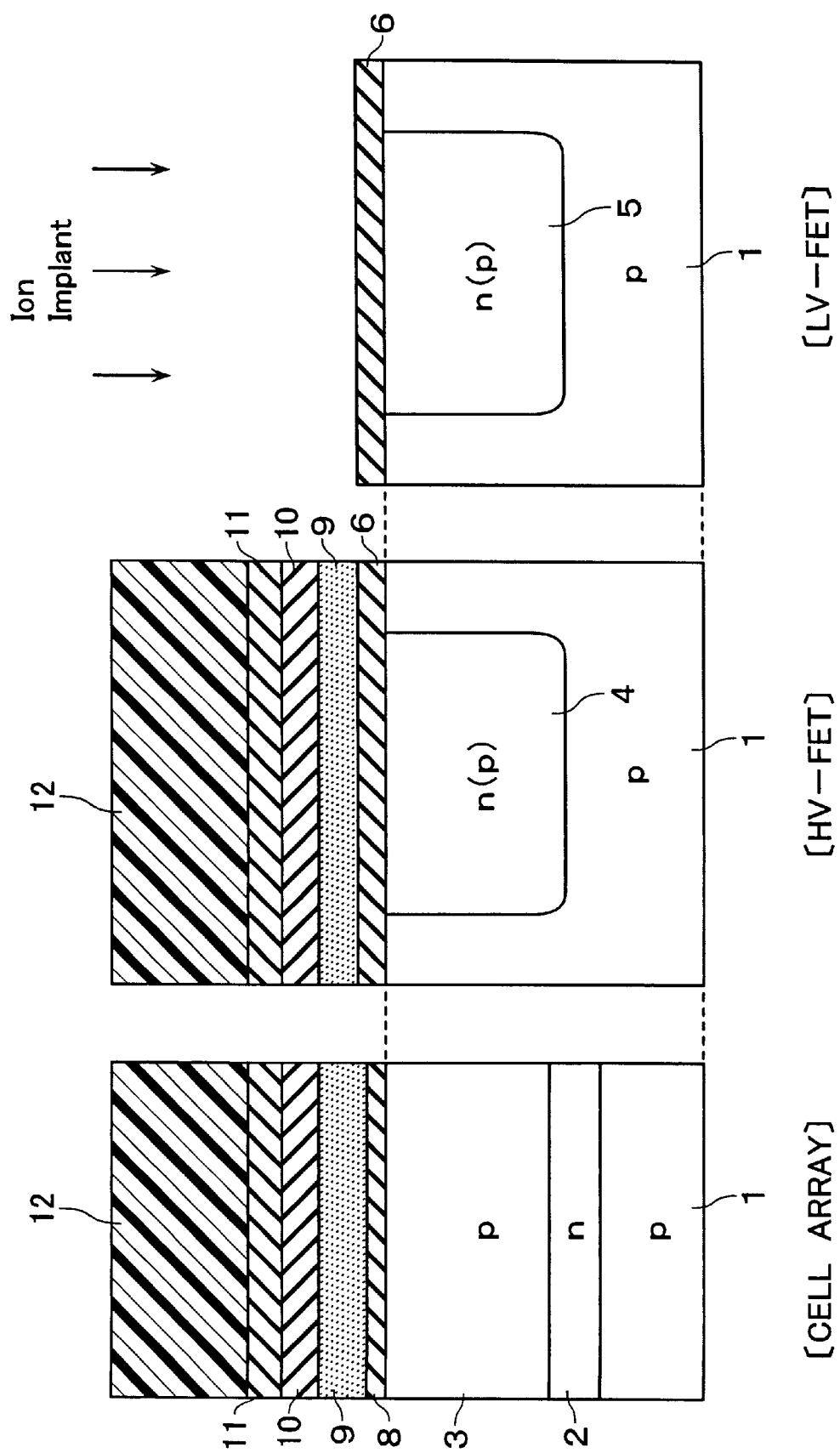
FIG. 4 is a sectional diagram showing a resist process for gate oxide film removal in a low voltage transistor region of the embodiment.

Thereafter, as shown in FIG. 4, a patterned resist mask 12 is formed to cover the cell array region and the HV-FET region. Then, use reactive ion etching (RIE) techniques to etch the silicon oxide film 11, silicon nitride film 10, polysilicon film 9 and gate oxide film 6 of the LV-FET region in this order of sequence. At this time, preferably, channel ion implant for LV-FET threshold voltage adjustment is done through the gate oxide film 6, which resides as shown in FIG. 4.

In this way, performing LV-FET channel ion implantation through the gate oxide film 6 used for the HV-FET after formation of the gate dielectric films of the cell array and HV-FET makes it possible to suppress or minimize risks of unwanted rediffusion of channel impurities otherwise occurring due to thermal processing of the LV-FET. In particular, while most LV-FETs under strict requirements for high-speed performance and threshold voltage stability are generally significant in influenceability of impurity rediffusion due to thermal processes, the illustrative embodiment is such that the impurity rediffusion of this kind may be suppressed, thus enabling achievement of high performance.

It must be noted here that successful channel ion implantation into respective ones of the n-channel and p-channel as included in the LV-FET region requires a lithography process for removing a resist mask 12 and then sequentially forming two resist masks used for ion implantation of p- and n-channels.

Also note that performing the ion implantation through the gate oxide film 6 can cause variation or fluctuation of the carrier concentration profile of an impurity doped, as a result of surface damages of the polysilicon film 9 overlying the gate oxide film 6, which damages occur during etching processes. An approach to avoiding this problem is to perform etch removal up to the gate oxide film 6, then remove the resist mask 12, and thereafter newly form a buffer oxide film in the LV-FET region to a thickness of about 10 nm. Then, perform channel ion implantation through this buffer oxide film. In this case the cell array region and the HV-FET region are such that a multilayer structure of the silicon oxide film 11 and silicon nitride film 10 plus polysilicon film 9 becomes an ion implant-proof mask with increased resistance against ion implantation. Whereby, the channel impurity concentration profile is controllable with enhanced accuracy, resulting in achievement of the intended LV-FET characteristics free from any threshold voltage fluctuation.

Figure 5:
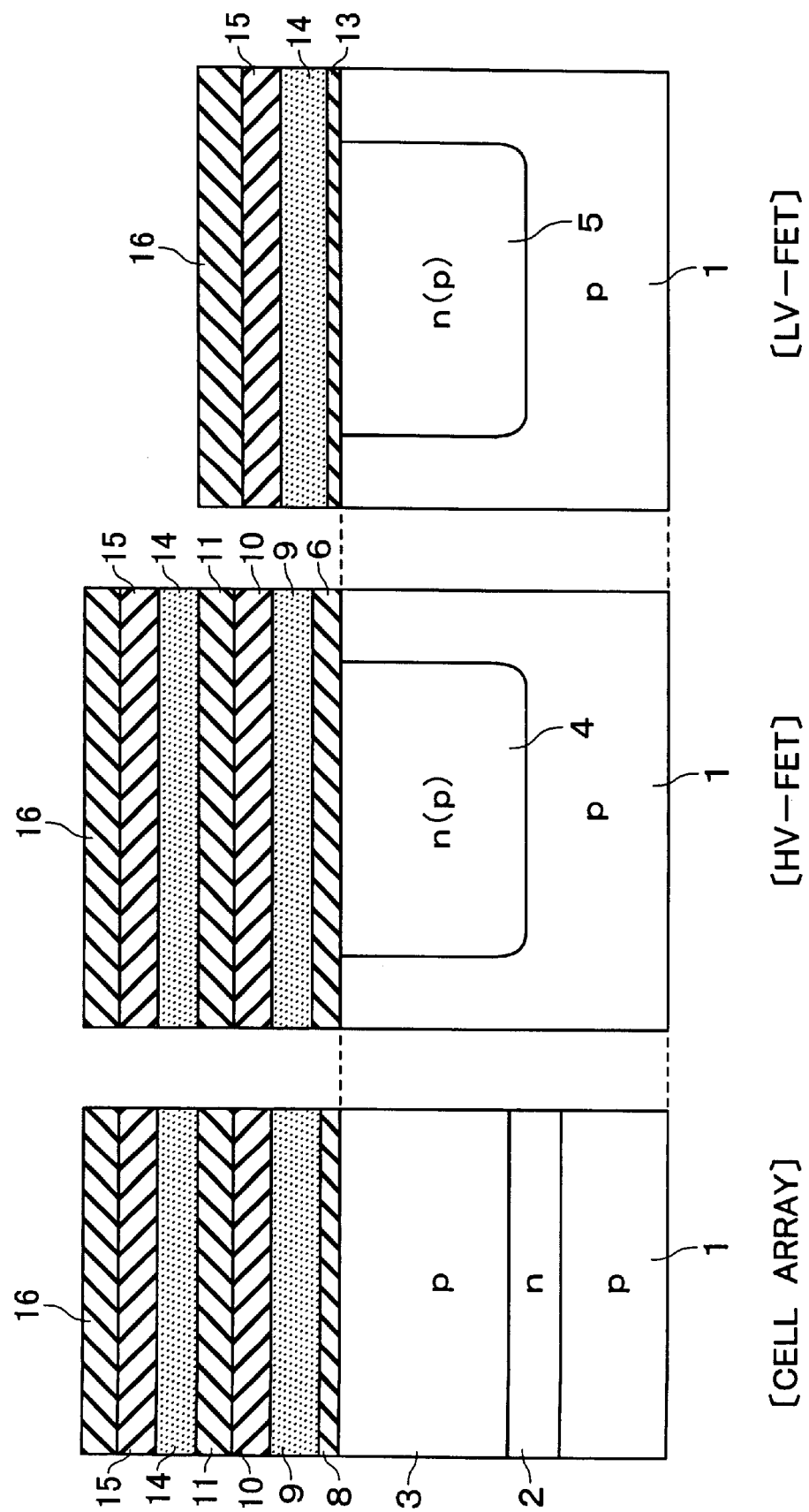
FIG. 5 is a sectional diagram showing a step of forming a gate oxide film of low voltage transistor of the embodiment and its following step of forming a polysilicon film and a silicon nitride film plus a silicon oxide film.

Thereafter, let a substrate surface portion in the LV-FET region be exposed. Then, as shown in FIG. 5, form in the LV-FET region of the substrate a gate oxide film 13 that is thinner than the tunnel oxide film 8. Typically the gate oxide film 13 is formed by thermal oxidation at 1000° C. for 60 seconds to a thickness of 5 nm. At this thermal oxidation step the cell array region and the HV-FET region are covered with the silicon oxide film 11 and silicon nitride film 10 plus polysilicon film 9; thus, the gate oxide film hardly increases in thickness.

After having formed the gate oxide film 13 in this way, as shown in FIG. 5, sequentially deposit by LPCVD techniques a polysilicon film 14 for use as a gate electrode material film along with a silicon nitride film 15 and a silicon oxide film 16 on the entire substrate surface. The polysilicon film 14 becomes part of transistor gate electrodes of the peripheral circuit. The silicon nitride film 15 will be used as a stopper film during dielectric film burying at a later step of element isolation process.

In the cell array region and HV-FET region, the polysilicon film 9 has been already formed which becomes part of the floating gates of memory transistors and is also for use as part of HV-FET gate electrodes, with the silicon nitride film 10 formed on this film 9. Accordingly, by lithography and etching processes not shown, the polysilicon film 14 and silicon nitride film 15 plus silicon oxide film 16 are to be selectively etched away while letting their portions be left in the LV-FET region only.

Figure 6:
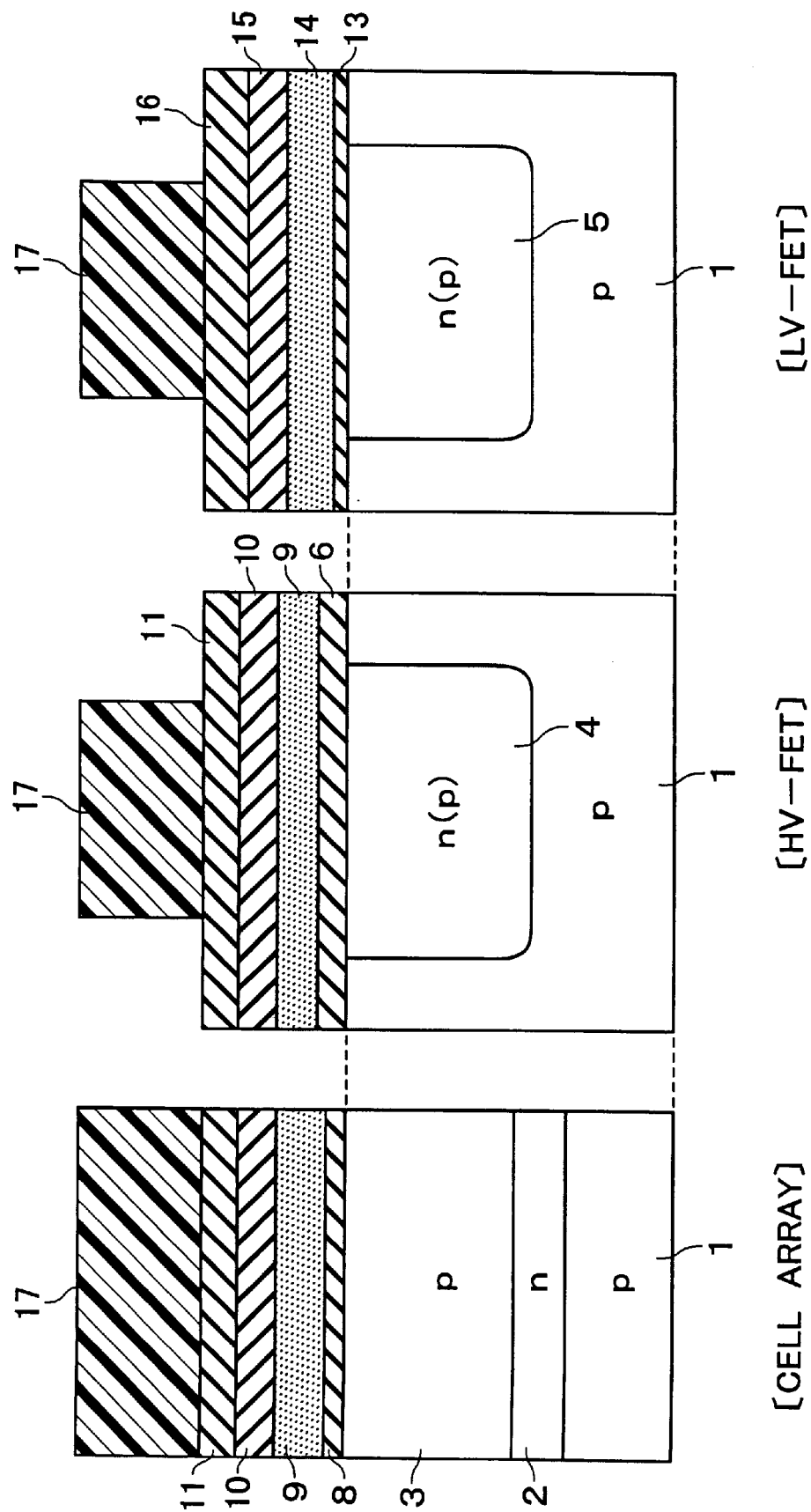
FIG. 6 is a sectional diagram showing a resist process for element isolation of the embodiment.
Figure 7:
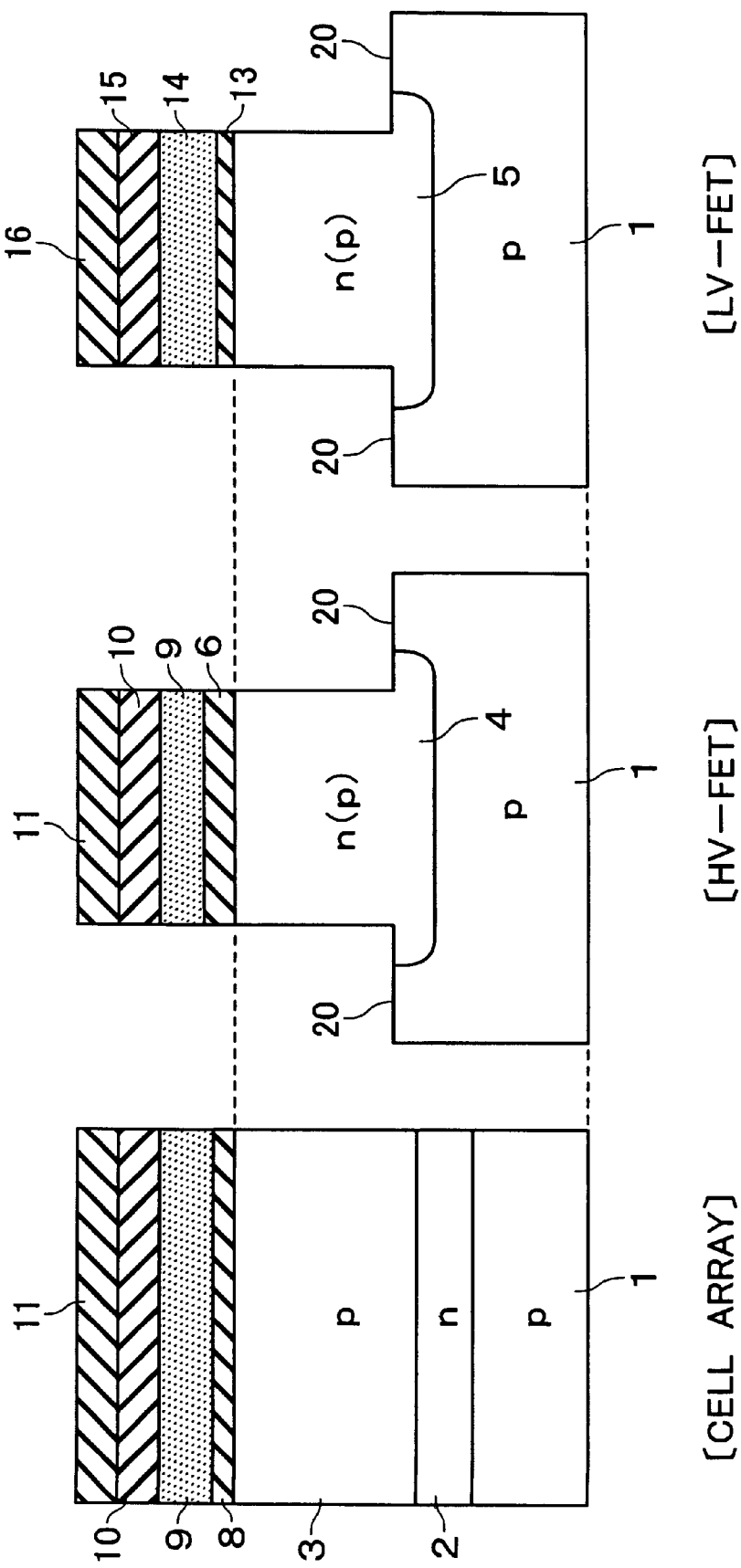
FIG. 7 is a sectional diagram showing an element isolating dielectric groove formation step in accordance with the embodiment.

Next, the fabrication procedure goes to an element isolation process step using shallow trench isolation (STI) techniques. As shown in FIG. 6, form a resist mask pattern 17 which has openings in element isolation regions. Then, sequentially etch by RIE the silicon oxide films 11, 16, silicon nitride films 10, 15, and polysilicon films 9, 14. Then, remove the resist mask 17. Next, further etch the silicon substrate 1 to a prespecified depth with the patterned silicon oxide films 11, 16 as a mask therefor. The result is that trench-like element isolation grooves 20 are formed in the element isolation region of the substrate as shown in FIG. 7.

Figure 8:
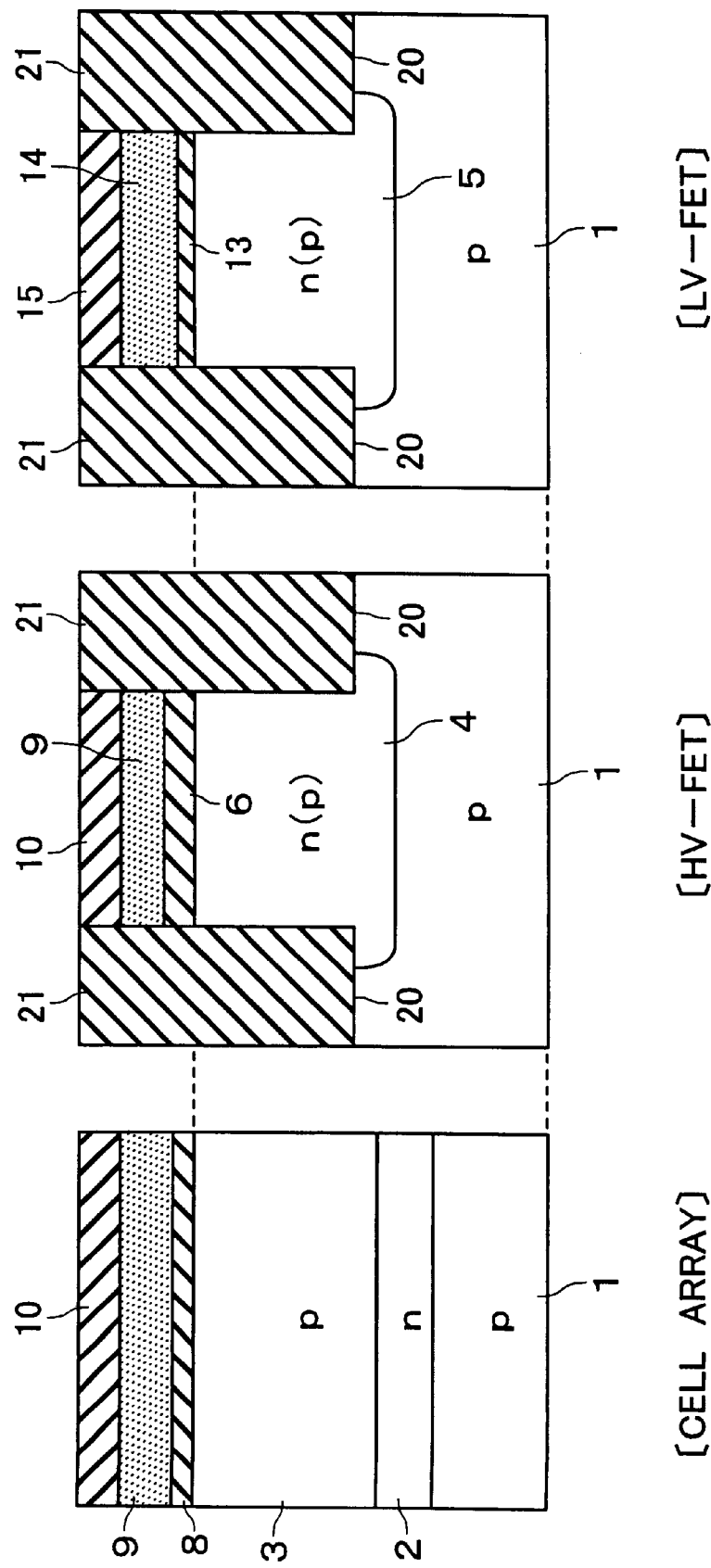
FIG. 8 is a sectional diagram showing an element isolating dielectric film burying step of the embodiment.

Next, deposit by CVD a silicon oxide film 21 to bury the element isolation grooves 20. Then, perform chemical mechanical polishing (CMP) treatment. Whereby, as shown in FIG. 8, the silicon oxide film 21 is buried in each element isolation groove 20 as an element isolating dielectric film. At the stage of this CMP processing, the silicon nitride films 10, 15 serve as an etch stopper. As shown in FIG. 8, the silicon oxide films 11, 16 overlying the silicon nitride films 10, 15 also are removed away.

Figure 9:
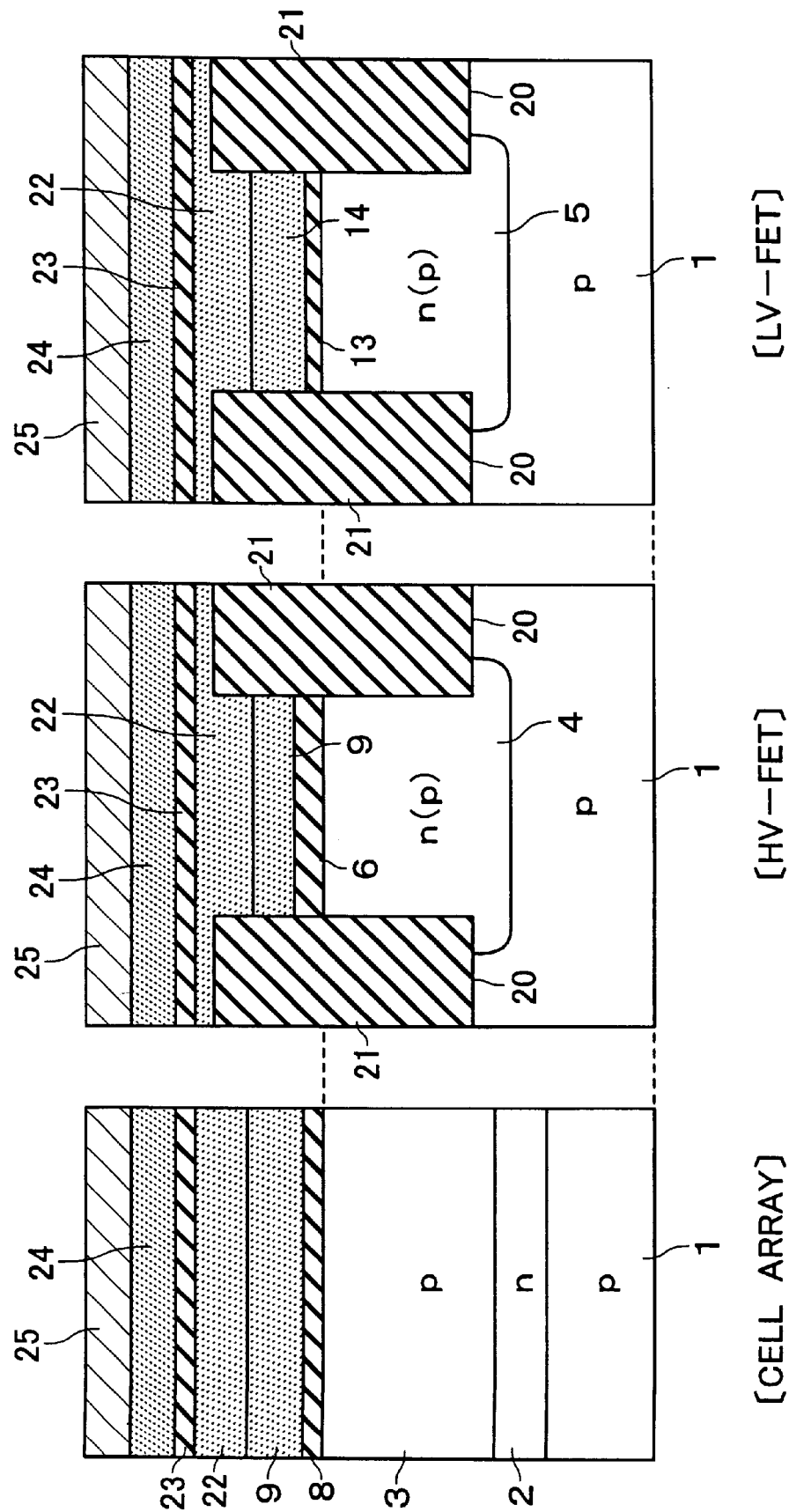
FIG. 9 is a sectional diagram showing a gate electrode material film lamination step of the embodiment.

After removal of the silicon nitride films 10, 15, deposit a polysilicon film 22 in an overall surface area of the resultant device structure as shown in FIG. 9. This polysilicon film 22 is for use as a gate electrode material film. After having formed the polysilicon film 22, form an oxy-nitride-oxide (ONO) film 23 for later use as an inter-gate dielectric film of the memory transistors, further deposit thereon a polysilicon film 24 and a WSi film 25, which are for use as gate electrode material.

Figure 10:
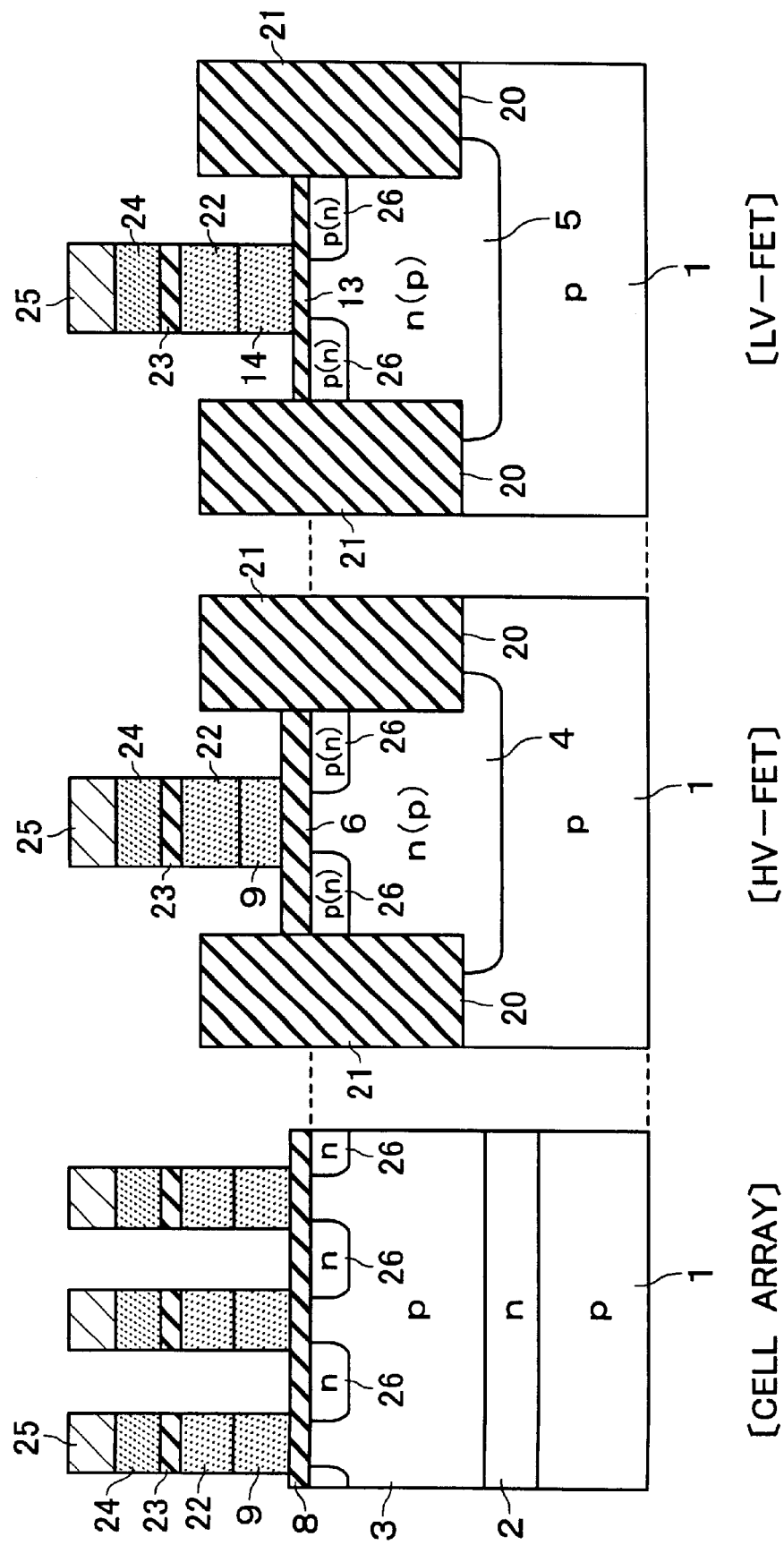
FIG. 10 is a sectional diagram showing a gate electrode patterning step of the embodiment.

Then, as shown in FIG. 10, perform etching to reach the gate oxide films 6, 8, 13 from the WSi film 25, thereby patterning and forming gate electrodes of the respective circuit regions. In the cell array region, the individual patterned portion of WSi film 25 and its underlying polysilicon film 24 become a control gate, whereas a lamination of polysilicon films 22, 9 becomes a floating gate.

In the peripheral circuit region, the ONO film 23 is of no use. However, in case a pattern of gate electrodes is formed while leaving this film, more than one contact hole may be formed for causing polysilicon film 24 to come into contact with the polysilicon film 22 which underlies ONO film 23. Alternatively, after having formed ONO film 23 on the entire surface, etching removal may be done while letting this reside in the cell array region only. In such case, in order to avoid direct contact of a resist mask with ONO film 23, ONO film 23 is preferably patterned while forcing ONO film 23 to be covered or coated with a thin polysilicon film.

After having patterned the gate electrodes in respective circuit regions in the way stated above, dope chosen impurity ions into each element region by ion implant techniques, thus forming source/drain diffusion layers 26. Practically the ion implant is done after formation of resist patterns in units of p- and n-channel regions.

Figure 11:
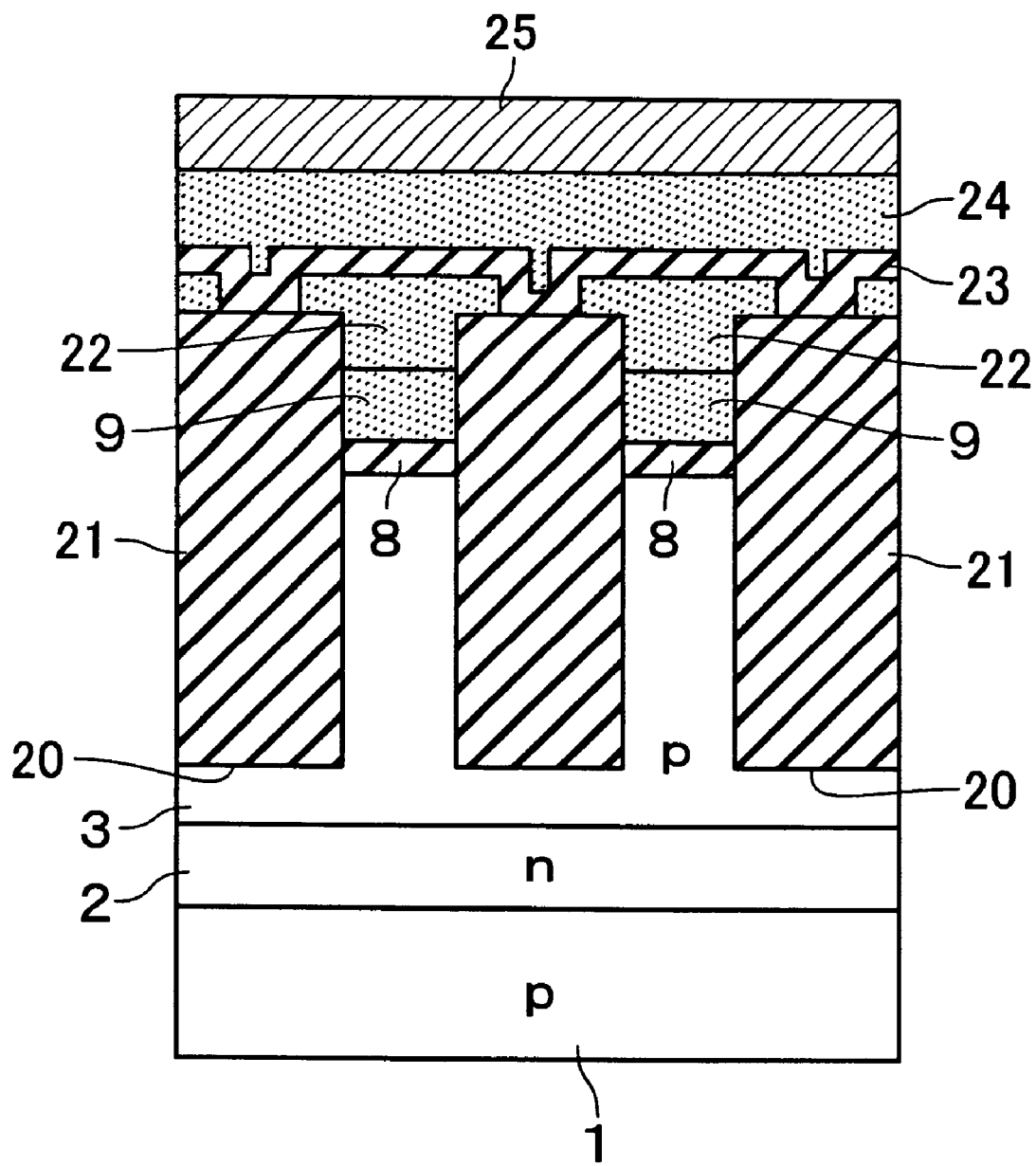
FIG. 11 is a diagram showing a sectional view, as taken along word lines, of a cell array region in accordance with the embodiment.

The cell array is such that a plurality of memory transistors are serially connected together with a diffusion layer 26 being commonly used or "shared" by neighboring ones of the memory transistors, thereby constituting a NAND cell. Although in the fabrication process discussed up to here the cell array region is indicated with respect to a cross-section in a channel direction (cross-section along bit lines), its another cross-section in a direction at right angles thereto (cross-section along word lines) is as shown in FIG. 11. In this cross-section, the element isolation dielectric film 21 for electrical separation or isolation between memory transistors is made visible, which film was formed at the previous element isolation process step of FIG. 8. Additionally, the polysilicon film 22 which becomes part of the floating gates requires slit processing after film deposition. This processing is for isolation on the element isolation regions. The result of this slit processing is that the floating gates each consisting of the stacked or laminated polysilicon films 9, 22 are separated in units of memory transistors. The control gates each made up of the WSi film 25 and its underlying polysilicon film 24 are patterned continuously in this cross-section and thus act as a control gate line (word line).

Although not specifically illustrated herein, sidewalls and a top surface of each gate electrode are covered by a silicon nitride film prior to formation of the source/drain diffusion layers 26 in an actually implemented process. Thereafter, deposit an interlayer dielectric (ILD) film to cover the entire surface of the substrate in which the cell array and the peripheral circuit is formed; then, form metallic on-chip lead wires including bitlines of the cell array and others on the interlayer dielectric film, although not specifically depicted herein.

An advantage of this embodiment is that the tunnel dielectric film thickness controllability is made higher because of the fact that the thermal processing for HV-FET gate insulator film formation is performed prior to the tunnel dielectric film formation in the cell array region. Another advantage of the embodiment lies in obtainability of reliability-enhanced memory transistors. This can be said because the tunnel dielectric film of the cell array is covered by the gate electrode material film immediately after formation thereof to ensure that any possible resist contamination is precluded in the absence of risks as to direct contact of resist material therewith. A further advantage is as follows. As the channel ion implantation in the cell array region also is done after completion of HV-FET gate oxide film fabrication, the resulting channel impurity distribution is free from the influence of thermal processes for HV-FET gate insulator film formation. This enables achievement of high-performance memory transistors. Another further advantage is that any extra lithography processes are no longer required because the channel ion implant in this cell array may be done prior to the gate insulator film etching process while simply using as a mask the resist mask for selective etching of the HV-FET-use gate insulator film, which mask has been formed in the cell array region before the tunnel dielectric film formation.

Embodiment 2

FIGS. 12 to 19 show a fabrication process in accordance with another embodiment of this invention which is applied to a NAND-type EEPROM as in Embodiment 1, in the form of cross-sections of three major parts thereof: a cell array region, HV-FET region and LV-FET region, wherein the HV/LV-FET regions are in a peripheral circuit of the NAND-EEPROM.

Figure 12:
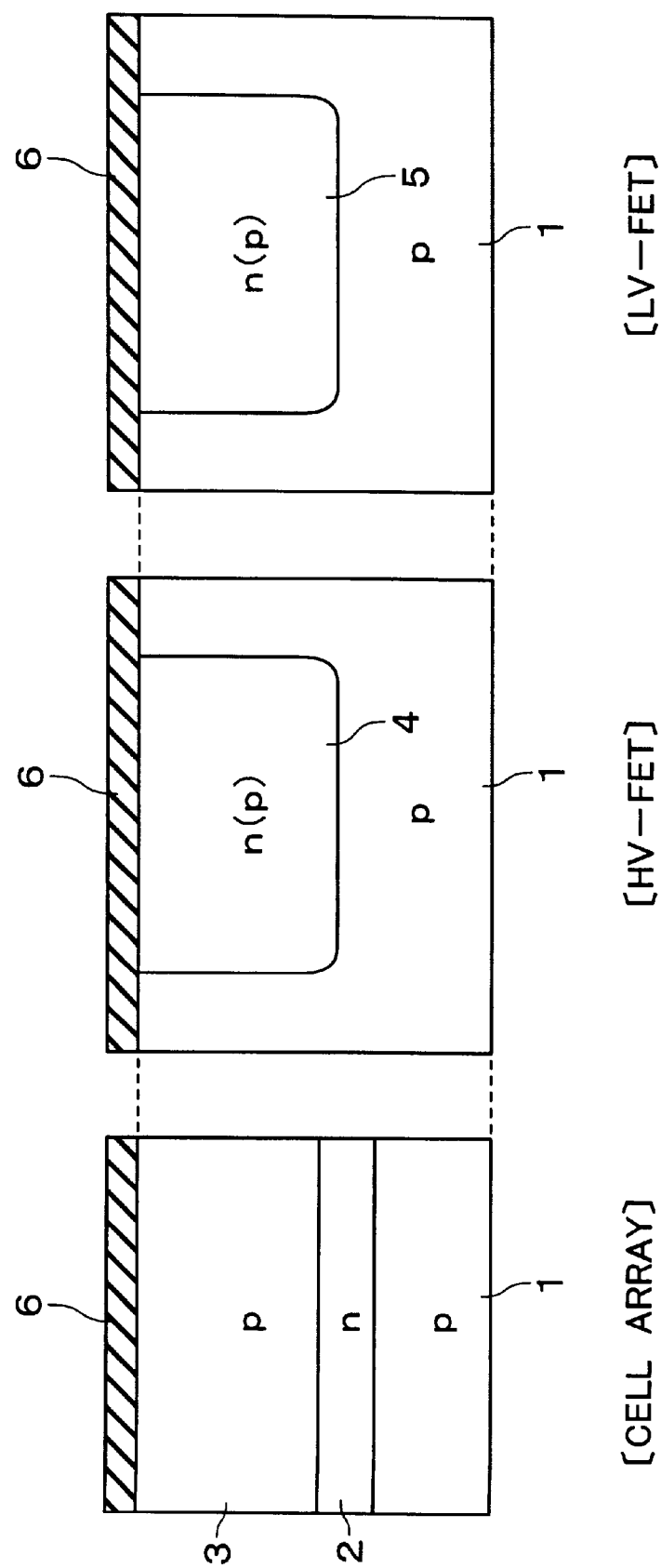
FIG. 12 is a sectional diagram showing a step of forming a gate oxide film of high voltage transistor in accordance with another embodiment of this invention.
Figure 13:
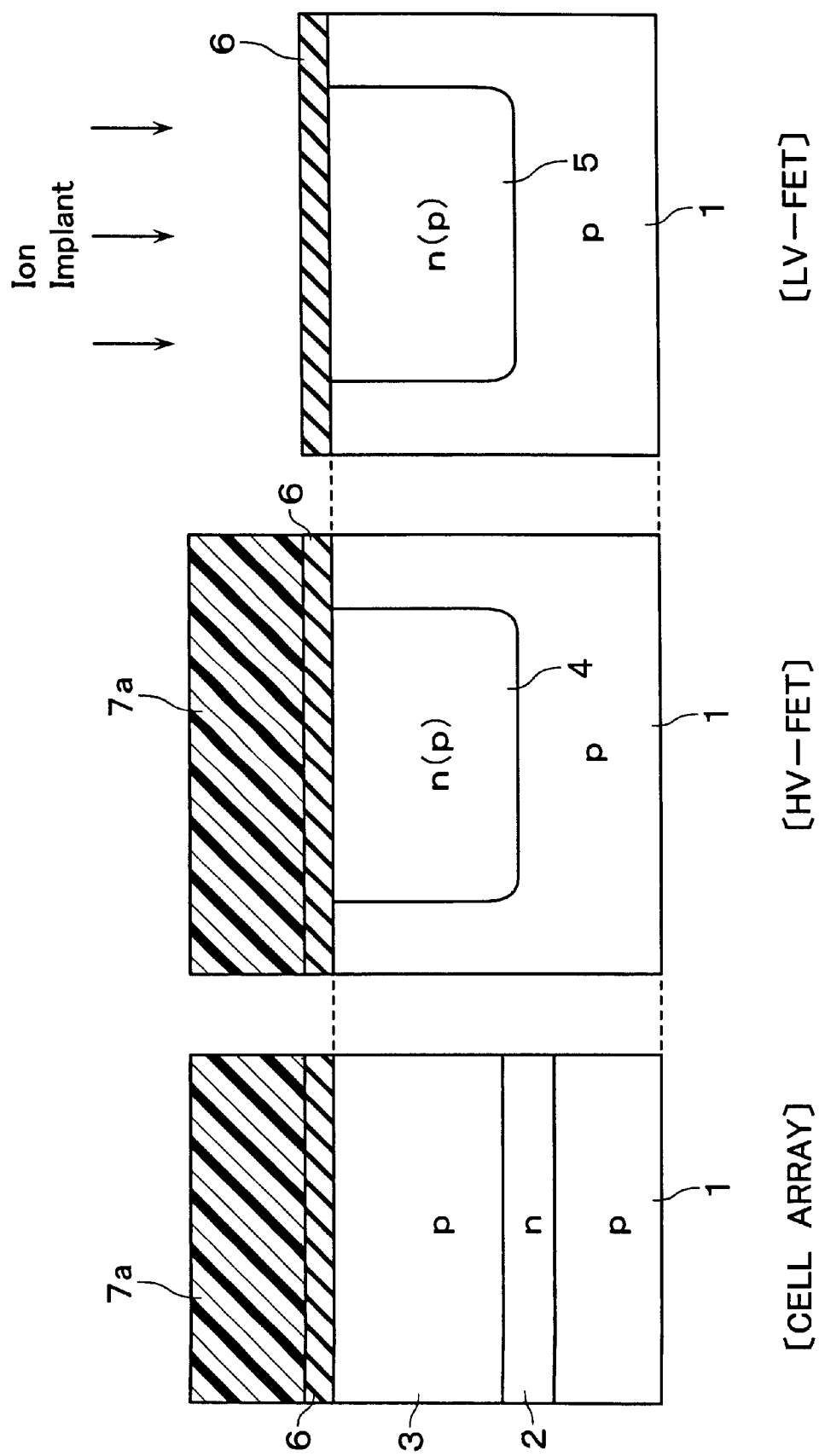
FIG. 13 is a sectional diagram showing a resist process for gate oxide film removal in a low voltage transistor region of the same embodiment.

In a similar way to FIG. 1 of the previous embodiment, FIG. 12 shows an "intermediate product" device structure which has a p-type silicon substrate 1 with wells 2–5 formed in respective circuit regions and also with a gate oxide film 6 formed thereafter on an entire surface for use in HV-FETs. The gate oxide film 6 may be a silicon oxide film with a thickness of 30 nm, which is formed by thermal oxidation at 1150° C. for 200 seconds. Thereafter, in this embodiment, a resist mask pattern 7a is formed in such a manner as to cover both the cell array region and the HV-FET region as shown in FIG. 13.

This resist mask 7a is then used to etch away a portion of the gate oxide film 6 in the LV-FET region. Preferably, prior to such etch treatment, channel ion implantation for LV-FET threshold voltage adjustment is performed through the gate oxide film 6. Accordingly, any extra lithography for LV-FET channel ion implantation is rarely required. Additionally, since the HV-FET's gate oxide film 6 is already formed, the LV-FET is accurately controllable in channel impurity concentration profile.

To perform ion implantation into respective n- and p-channels of the LV-FET, a need is felt to effectuate a lithography process for sequentially forming two resist masks used for ion implantation of the p- and n-channels, prior to formation of the resist mask 7a.

Figure 14:
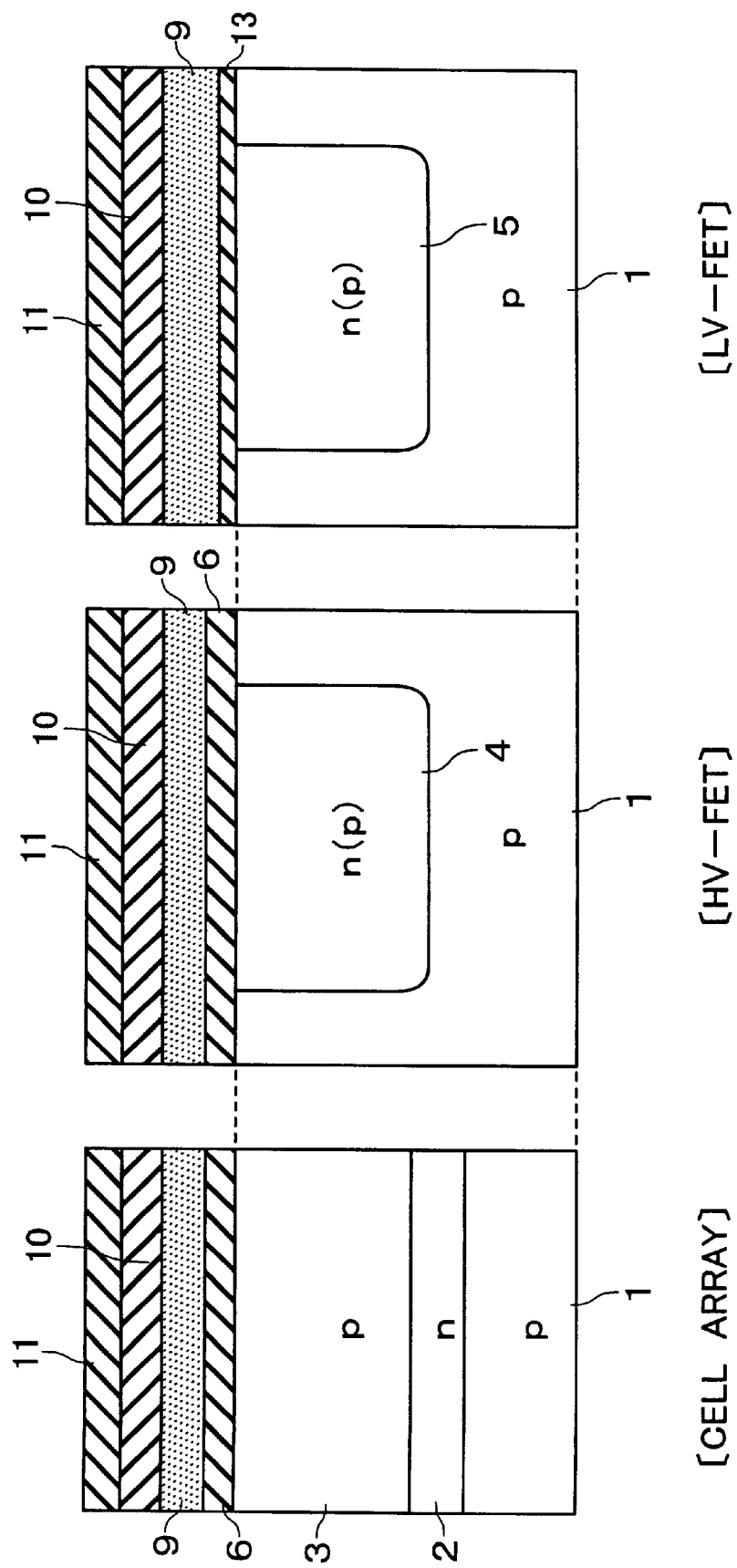
FIG. 14 is a sectional diagram showing a step of forming a gate oxide film of low voltage transistor of the embodiment and its following step of forming a polysilicon film, a silicon nitride film and a silicon oxide film.

After having removed a portion of the gate oxide film 6 in the LV-FET region, remove the resist mask 7a. Then, as shown in FIG. 14, form a gate oxide film 13 of the LV-FET oh the exposed substrate, which film is thinner than the gate oxide film 6. Practically the gate oxide film 13 is formed by thermal oxidation at 1000° C. for 60 seconds to a thickness of 5 nm. At this thermal oxidation step the preformed gate oxide film 6 grows to have an increased thickness of about 35 nm.

Continuously, after formation of the gate oxide film 13, as shown in FIG. 14, employ LPCVD techniques to sequentially form on the entire substrate surface a polysilicon film 9 with a thickness of about 40 nm for use as a gate electrode material film, a silicon nitride film 10 of 40-nm thickness, and a 40-nm thick silicon oxide film 11. Polysilicon film 9 is the one that will become part of the gate electrodes of peripheral circuit transistors. Silicon nitride film 10 is used as a stopper film during burying of a dielectric film at a later element isolation process step.

Figure 15:
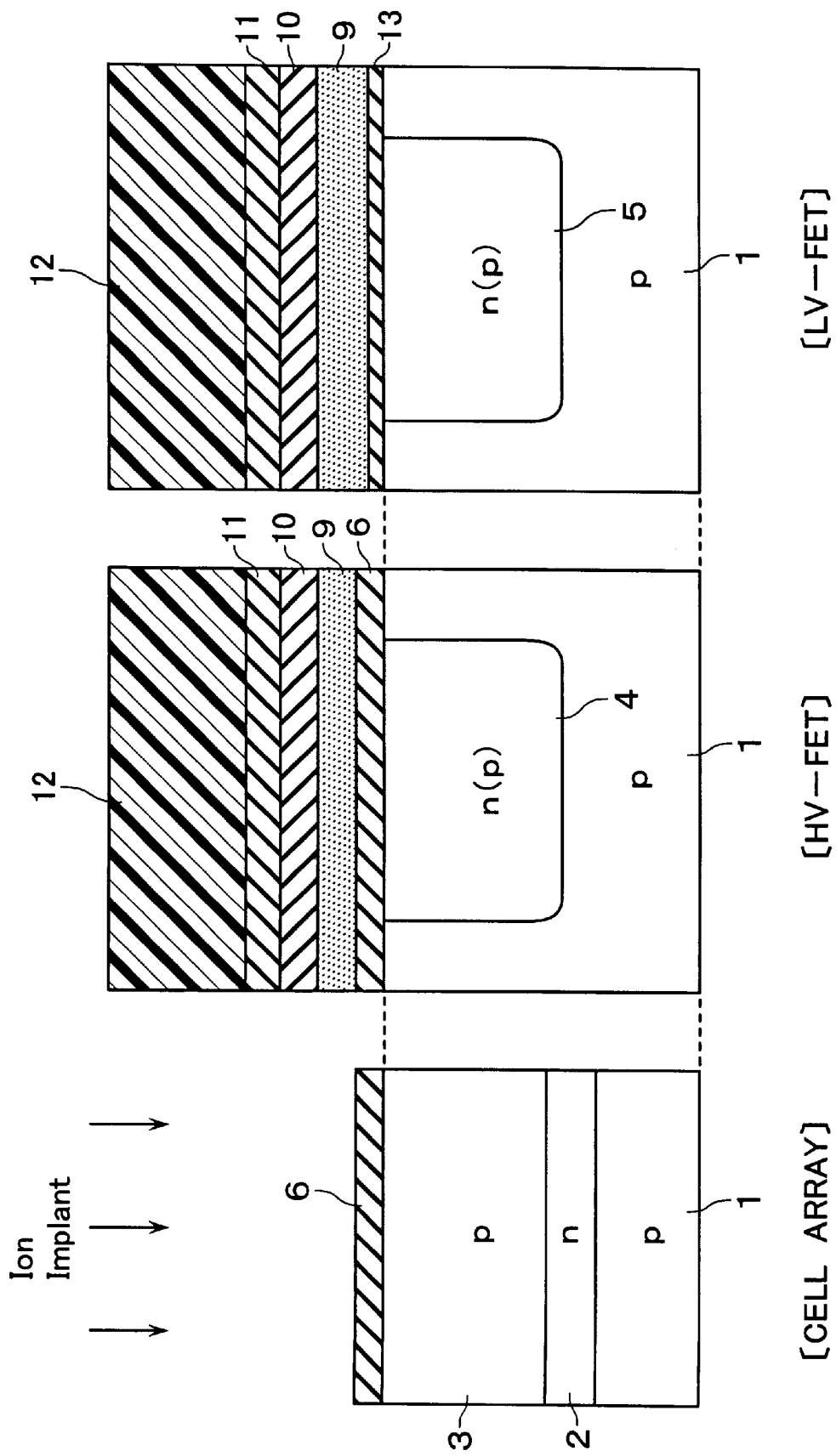
FIG. 15 is a sectional diagram showing a resist process for gate oxide film removal in a cell array region of the embodiment.

Thereafter, as shown in FIG. 15, form a resist mask 12a which covers the peripheral circuit region. Then, etch away the cell array region's silicon oxide film 11, silicon nitride film 10 and polysilicon film 9. Subsequently, etch away the gate oxide film 6 also. Preferably, prior to this etch treatment of the gate oxide film 6, perform channel ion implantation for threshold voltage adjustment in the cell array region while letting gate oxide film 6 be left.

In the case of this embodiment also, since the high-temperature/long-time thermal processing for formation of the HV-FET gate oxide film 6 has been completed, later occurring re-diffusion of a doped impurity in the cell array region is well suppressed. Thus it is possible to permit resultant ultrafine memory transistors to offer enhanced performance. Optionally, not exclusively for the channel ion implant of the cell array region, the p-type well 3 and n-type well 2 of the cell array region may also be formed through ion implant at this stage of the fabrication process. Whereby, rediffusion of well impurities is also suppressed while avoiding the need for any extra lithography for well formation, thus enabling simplification of the process as a whole.

Figure 16:
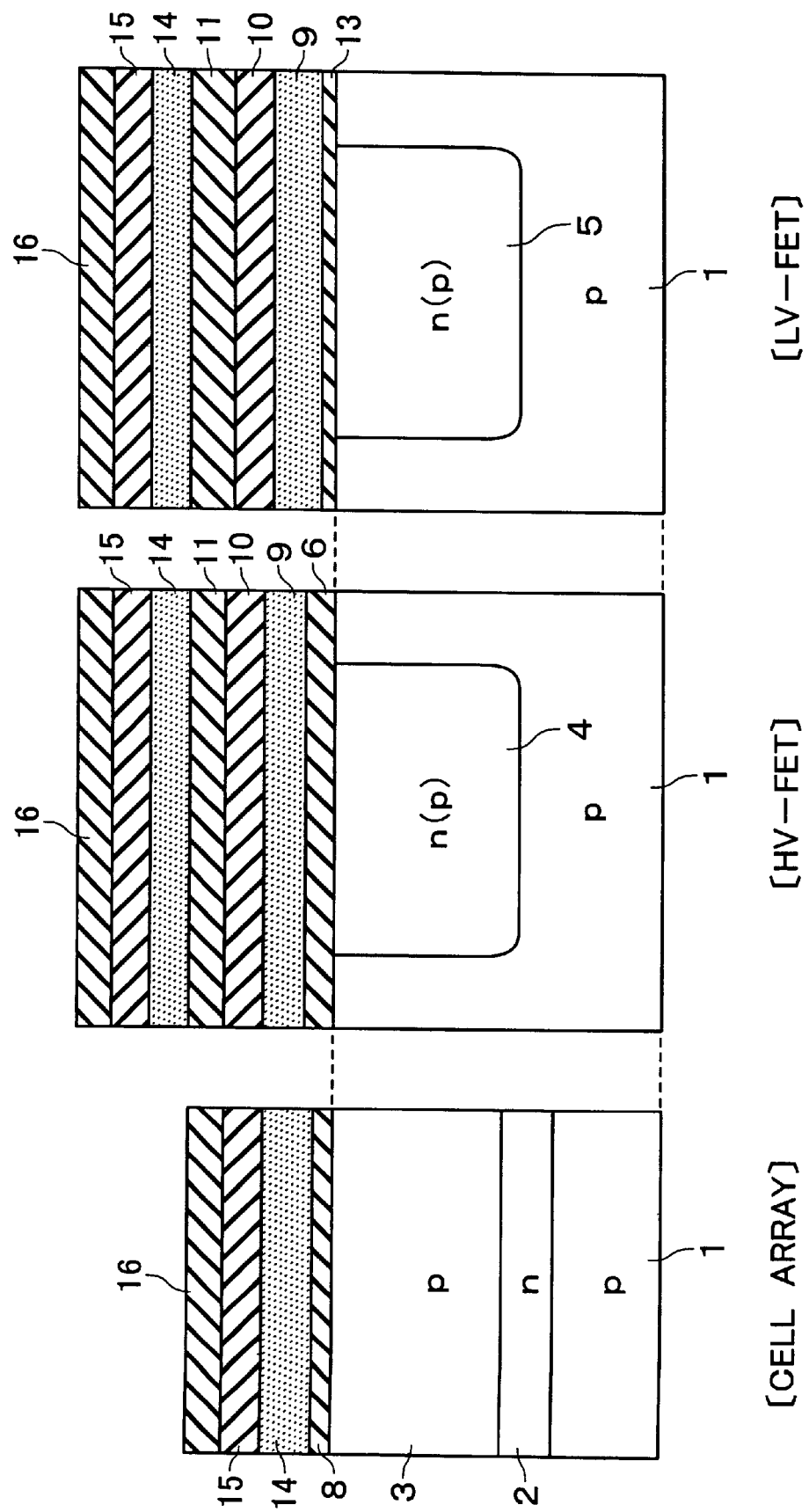
FIG. 16 is a sectional diagram showing a step of forming a gate oxide film of the cell array of the embodiment and its following step of forming a polysilicon film, silicon nitride film and silicon oxide film.

As shown in FIG. 16, after having etched away the gate oxide film 6 and then removed the resist mask 12*a*, form in the cell array region of the substrate a gate oxide film (tunnel dielectric film) 8. This tunnel dielectric film 8 is thinner than the gate oxide film 6 in the HV-FET region and yet thicker than the gate oxide film 13 in the LV-FET region. More practically, the tunnel dielectric film 8 is formed as an 8-nm thick oxide film by thermal oxidation at 1000° C. for 60 sec.

Further, use LPCVD techniques to sequentially deposit on the entire substrate surface a polysilicon film 14 for use as a gate electrode material film, a silicon nitride film 15 and a silicon oxide film 16. Polysilicon film 14 becomes part of floating gates of memory transistors and also as part of peripheral circuit transistor gate electrodes. Silicon nitride film 15 is the one that will be used as a stopper film during dielectric film burying at a later step of element isolation process.

As the polysilicon film 9 covered with the silicon nitride film 10 for use as an etch stopper is formed in the HV- and LV-FET regions in the peripheral circuit region, the silicon oxide film 16 and silicon nitride film 15 plus polysilicon film 14 overlapping these regions are to be removed by lithography and etching processes, not shown in the drawing.

Figure 17:
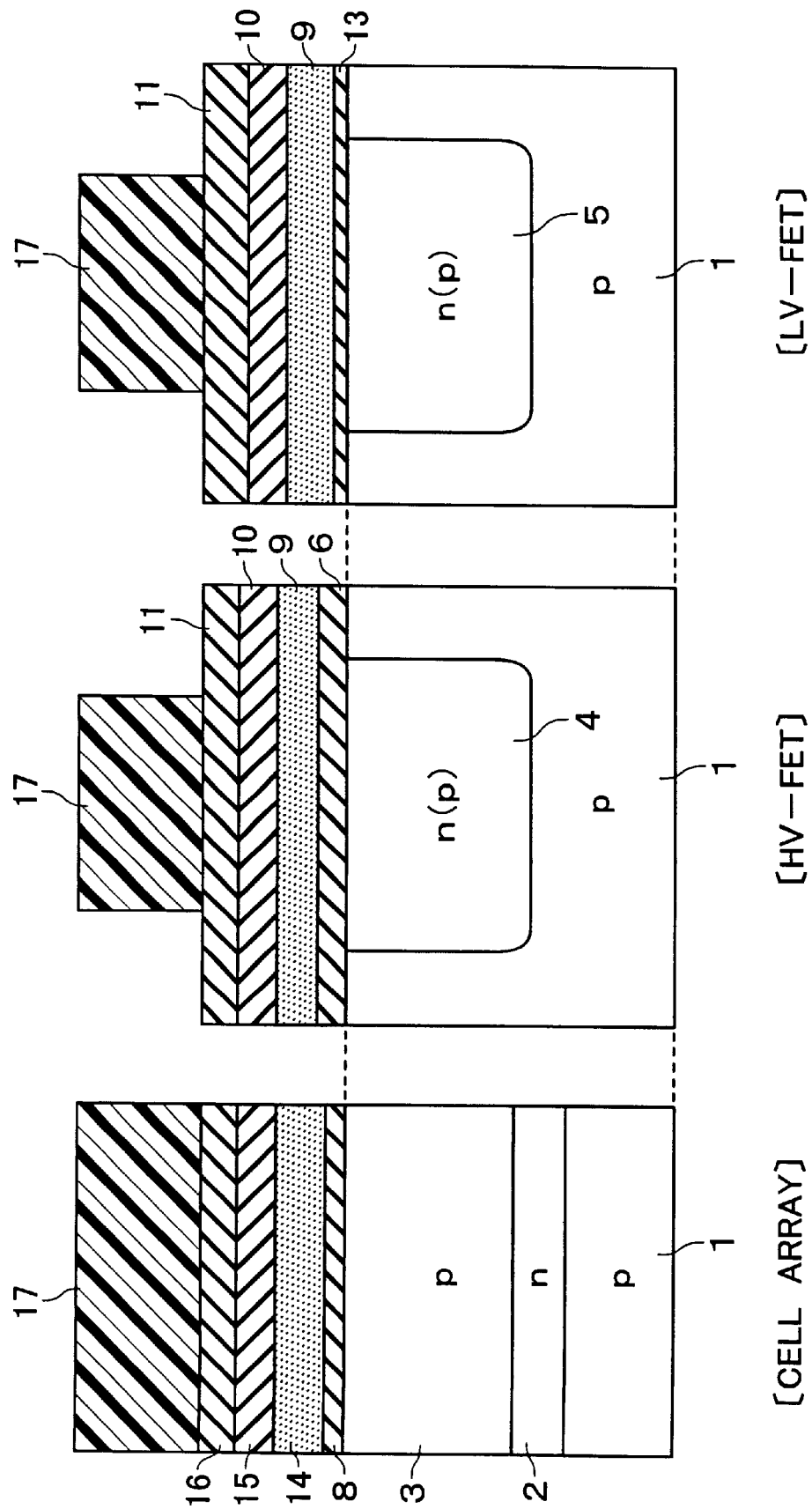
FIG. 17 is a sectional diagram showing a resist process for element isolation of the embodiment.
Figure 18:
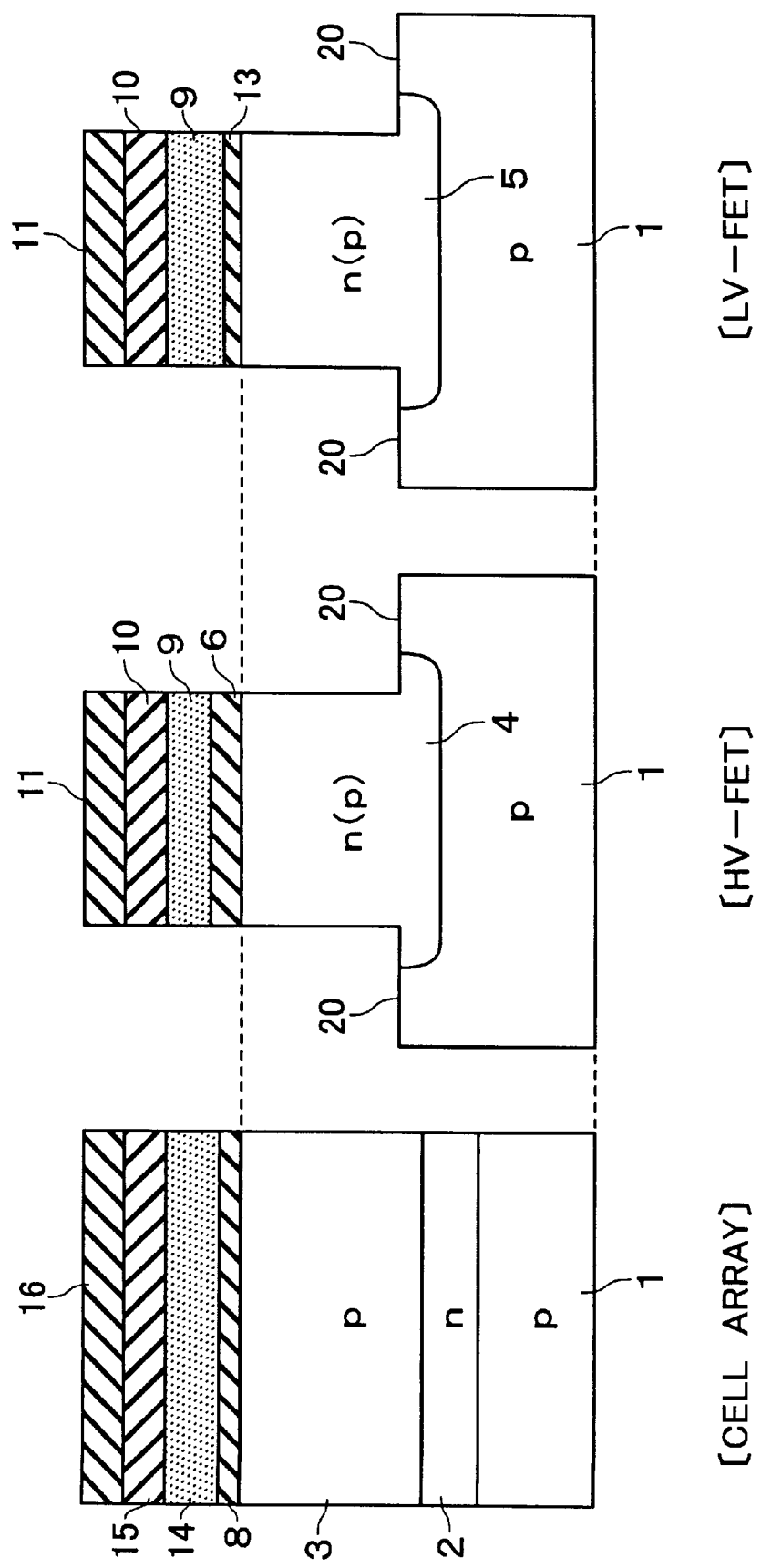
FIG. 18 is a sectional diagram showing an element isolation groove formation step in accordance with the embodiment.

Next, the fabrication procedure enters an element isolation process step. As shown in FIG. 17, form a resist mask pattern 17 which has openings in element isolation regions. Then, sequentially apply RIE etching to the silicon oxide films 11, 16, silicon nitride films 10, 15, and polysilicon films 9, 14. Next, remove the resist mask 17; then, further etch the silicon substrate 1 to a predetermined depth with the patterned silicon oxide films 11, 16 as a mask. Thus, element isolation grooves or "trenches" 20 are defined as shown in FIG. 18.

Figure 19:
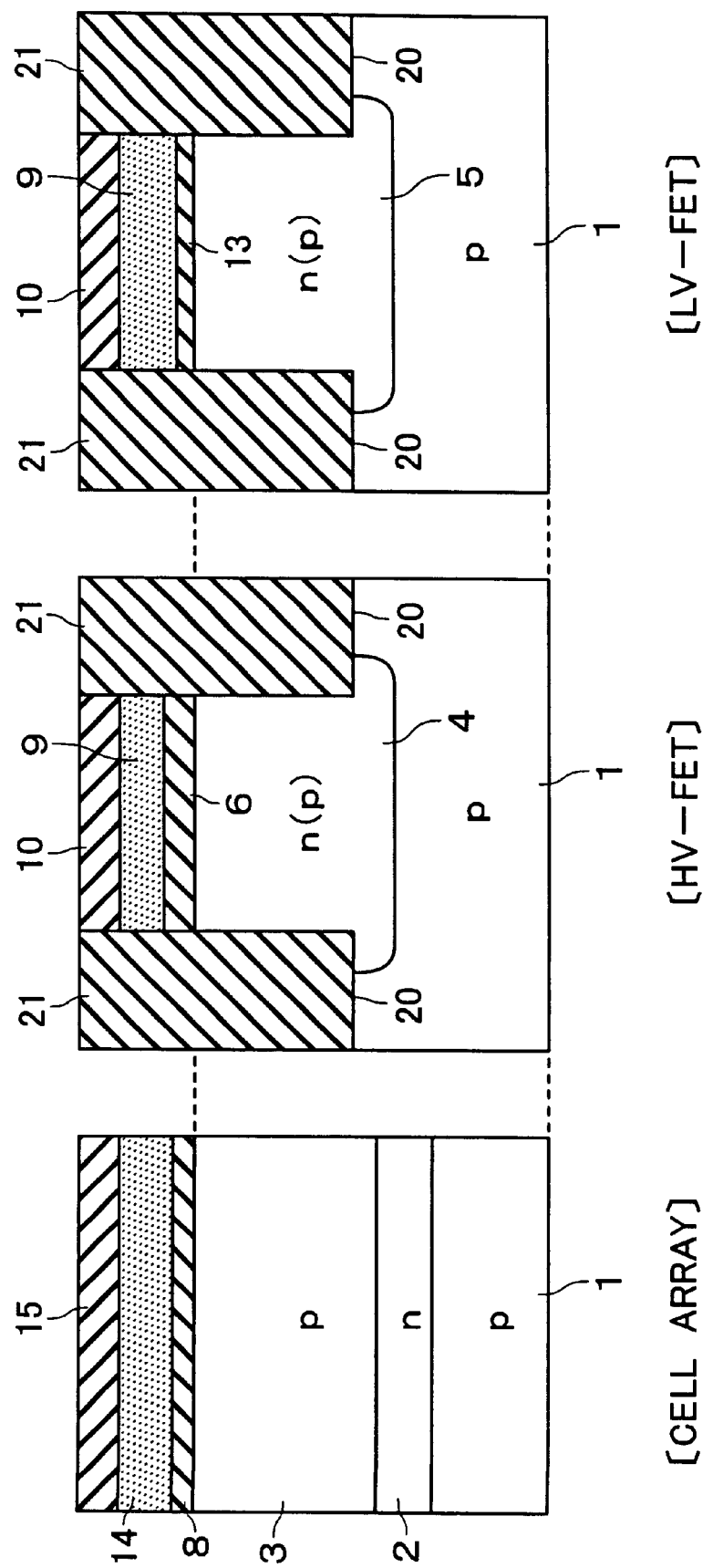
FIG. 19 is a sectional diagram showing an element isolation dielectric film burying step of the embodiment.
Figure 20:
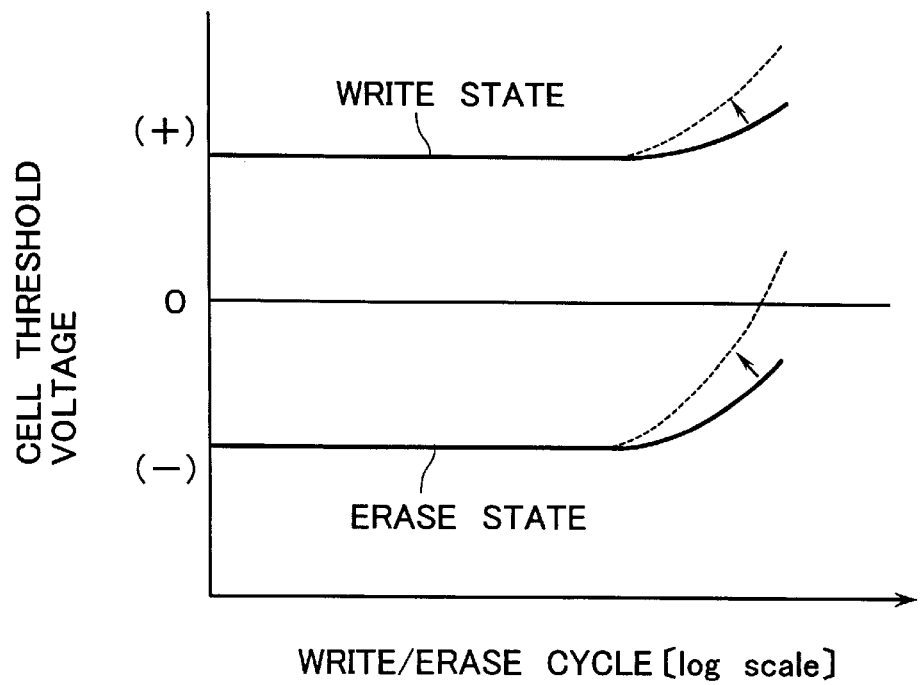
FIG. 20 is a diagram graphically showing the characteristics of nonvolatile memory transistors as to threshold voltage variation or fluctuation due to write/erase cycles thereof.

Next, deposit by CVD a silicon oxide film 21 to bury the element isolation trenches 20. Then, perform CMP processing to thereby bury the silicon oxide film 21 as an element isolation dielectric film as shown in FIG. 19. Thereafter, perform similar processes to Embodiment 1 to form elements in each region.

With this embodiment also, similar effects and advantages to those of the previous embodiment are obtainable.

Embodiment 3

Although in each of the above-stated embodiments the tunnel oxide film 8 that is the tunnel dielectric film of the cell array is discussed under an assumption that it is formed through thermal oxidation only, it is also effective that after the thermal oxide film formation, thermal processing is done under nitrogen-containing gaseous ambient conditions at 950° C. for about 60 minutes to thereby form it as an oxynitride film, which is an oxide film containing nitrogen therein. Using such oxynitride film as the tunnel dielectric film suppresses or minimizes any appreciable threshold voltage variation or fluctuation otherwise occurring due to repeated write/erase cycles.

Figure 21:
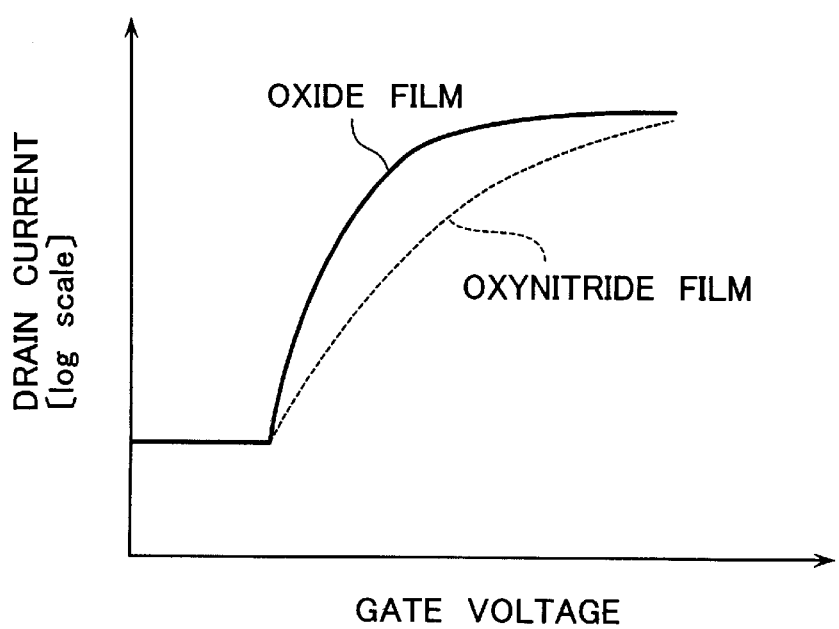
FIG. 21 is a graph showing static characteristics of transistors with different gate insulator film species, wherein solid line indicates a drain current versus gate voltage characteristic of a transistor with a gate oxide film whereas dotted line indicates that of a transistor with its gate insulator film made of oxynitride material.

On the other hand, it is known among experts in the semiconductor device art that in the case the gate dielectric film employs an oxynitride film to be formed through thermal oxidation and thermal nitridation, the sub-threshold characteristics of metal insulator semiconductor field effect transistors (MISFETs) are such that drain current rise-up becomes moderate as demonstrated in FIG. 21. In the case of Embodiment 1, the gate oxide film 6 also becomes an oxynitride film because the gate oxide film 8 of the cell array region is formed while letting the HV-FET gate oxide film 6 be exposed. In contrast, in the case of Embodiment 2, no such characteristics degradation occurs. This can be said because the tunnel dielectric film of the cell array is formed in the state that the peripheral circuit's gate oxide film is covered by both the polysilicon film and the silicon nitride film.

Although the respective embodiments stated supra are specifically drawn to NAND-type EEPROMs, this invention should not exclusively be limited thereto and may alternatively be applicable to other cell array types of EEPROM chips with similar memory transistors, including but not limited to NOR-type EEPROMs.

As has been described in Embodiments 1–3, it becomes possible to obtain the memory transistors with increased reliability and enhanced performance by performing the cell array gate dielectric film formation at least after formation of the HV-FET's gate dielectric film in the manufacture of a semiconductor memory chip having three kinds of gate dielectric films for use in memory transistors, HV-FETs and LV-FETs respectively.

Embodiment 4

Figure 22:
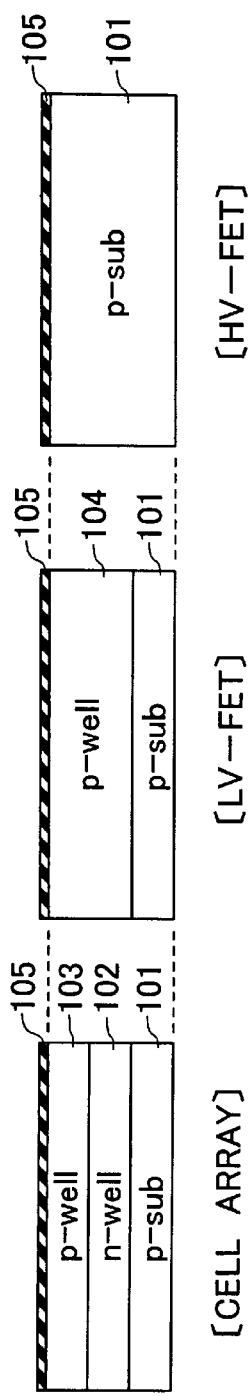
FIG. 22 is a sectional diagram showing a tunnel dielectric film fabrication process step in accordance with a further embodiment of the invention.

An explanation will next be given of a fabrication process of a flash memory of the NAND cell type in accordance with a further embodiment of the present invention, with reference to FIGS. 22–35. As shown in FIG. 22, form a required n-type well 102 and p-type wells 103–104 in each circuit region of a P-type silicon substrate 101 through ion implantation and diffusion, in a similar way to that of a respective one of the previous embodiments. Thereafter, form a gate oxide film 105 over the substrate for use as a tunnel dielectric film of memory transistors to a thickness of 8 nm in a dry atmosphere at 800° C.

Figure 23:
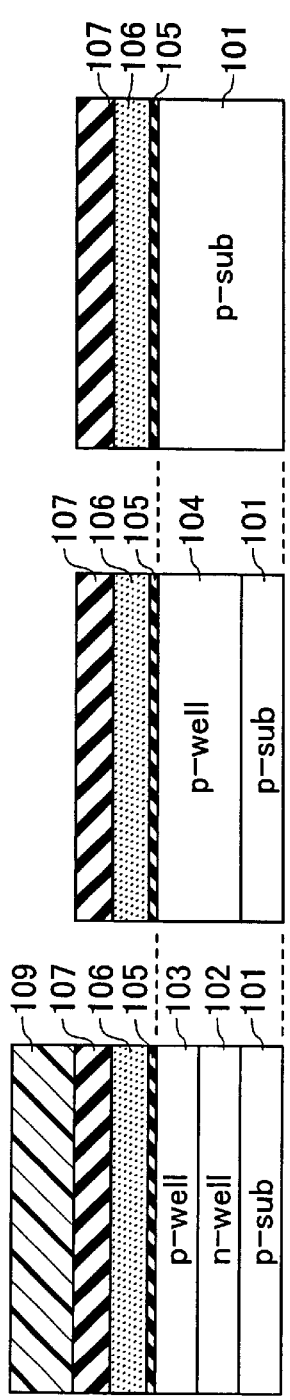
FIG. 23 is a sectional diagram showing a step of depositing a first polysilicon film and a stopper film in the same embodiment.
Figure 24:
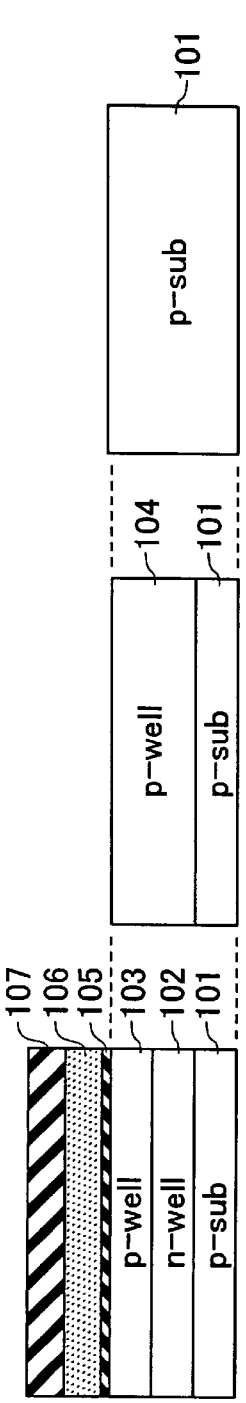
FIG. 24 is a sectional diagram showing a step of etching a polysilicon film of a peripheral circuit in the embodiment.

Thereafter, as shown in FIG. 23, deposit by low-pressure CVD (LPCVD) methods a polysilicon film 106 to a thickness of 40 nm. Subsequently form a silicon nitride film 107 with a thickness of 40 nm. Then form a resist pattern 109 in a cell array region. With this resist pattern 109 as a mask, etch away portions of the silicon nitride film 107, polysilicon film 106 and gate oxide film 105 in HV- and LV-FET regions of a peripheral circuit region, thereby exposing a substrate surface therein as shown in FIG. 24.

Figure 25:
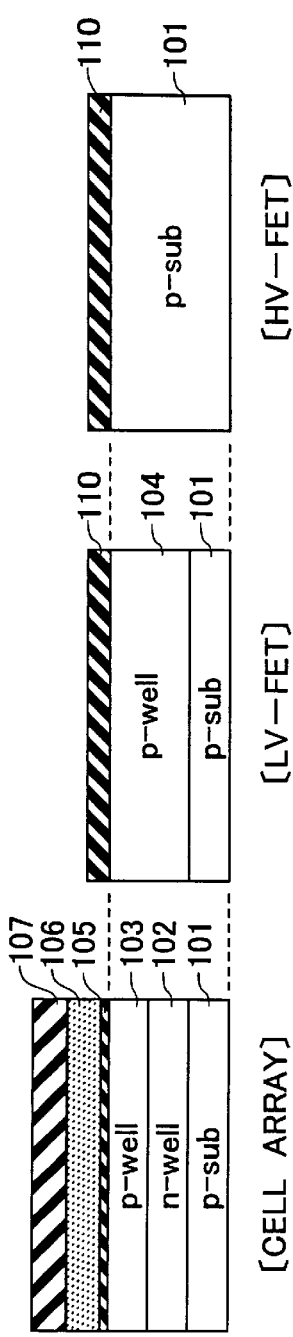
FIG. 25 is a sectional diagram showing a step of forming a gate insulator film for use with HV-FETs of the peripheral circuit in the embodiment.

Subsequently as shown in FIG. 25, form a 32-nm thick gate oxide film 110 for use in HV-FETs in the peripheral circuit region of the substrate in a wet atmosphere at 800° C.

Figure 26:
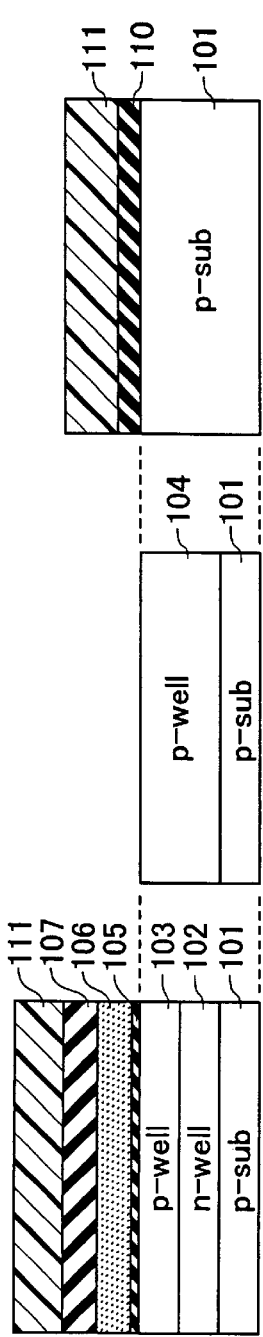
FIG. 26 is a sectional diagram showing a step of etching a gate insulator film of LV-FETs in the embodiment.

Next, as shown in FIG. 26, form a resist pattern 111 in the cell array region and the HV-FET region; then, use this resist pattern 111 as a mask to etch away a portion of the gate oxide film 110 as formed in the LV-FET region.

Figure 27:
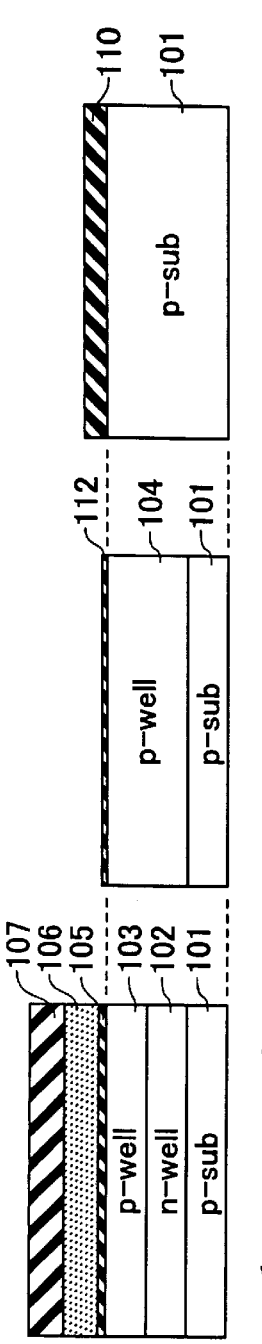
FIG. 27 is a sectional diagram showing a step of forming a gate insulator film for use with LV-FETs in the embodiment.

After removal of the resist pattern 111, perform oxidation in a dry atmosphere at 800° C. to form a gate oxide film 112 for use in LV-FETs in the LV-FET region of the substrate as shown in FIG. 27. This gate oxide film 112 is thinner than the tunnel dielectric film 105 of the cell array; preferably, film 112 is set at about 5 nm in thickness. During this oxidation process, the gate oxide film 110 grows in the HV-FET region, resulting in an increase in thickness from 32 nm up to 35 nm.

Next as shown in FIG. 28, form by known LPCVD methods a polysilicon film 113 on the entire substrate surface. This polysilicon film 113 has its thickness, which is greater by 40 nm than the thickness of polysilicon film 106 (40 nm) and thus measures 80 nm. Further, deposit a silicon nitride film 114 over the polysilicon film 106 to a thickness of 40 nm.

Thereafter as shown in FIG. 29, form a resist pattern 116 in the HV-FET region and the LV-FET region. With this resist pattern 116 as a mask, etch away portions of the silicon nitride film 114 and polysilicon film 113 residing in the cell array region.

Figure 30:
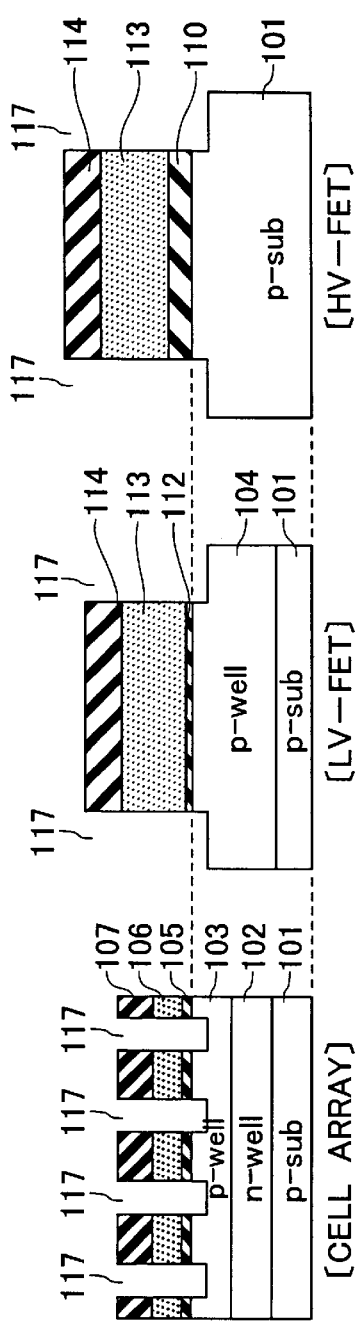
FIG. 30 is a sectional diagram showing a step of forming element isolation grooves in the embodiment.

Next, the fabrication procedure goes to an element isolation process step using STI techniques. Form a resist pattern, not shown, and then apply etching to the silicon nitride films 107, 114 in element isolation regions. Then, as shown in FIG. 30, use the resultant patterned silicon nitride films 107, 114 as a mask to etch away the polysilicon film 106, 113 and gate oxide films 105, 112, 110 and further the silicon substrate 101, thus forming element isolation trenches 117.

Figure 31:
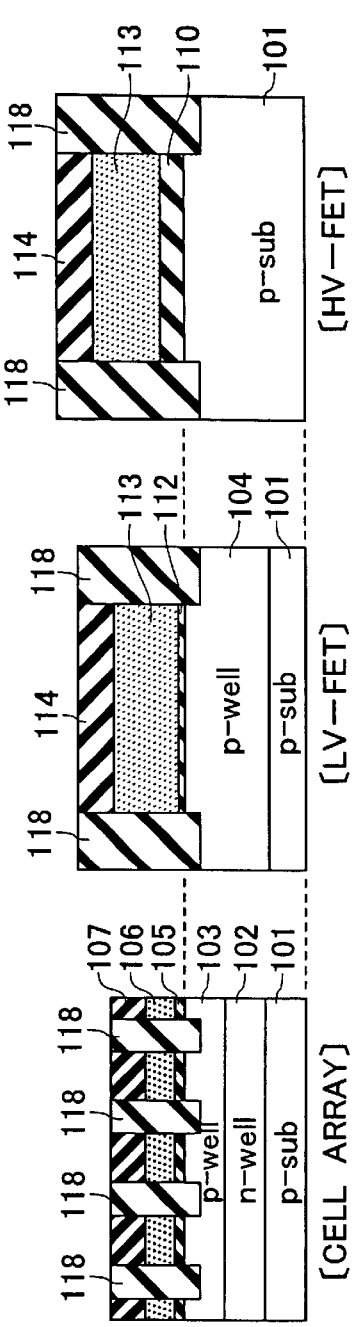
FIG. 31 is a sectional diagram showing a step of burying an element isolating dielectric film in the grooves in the embodiment.
Figure 32:
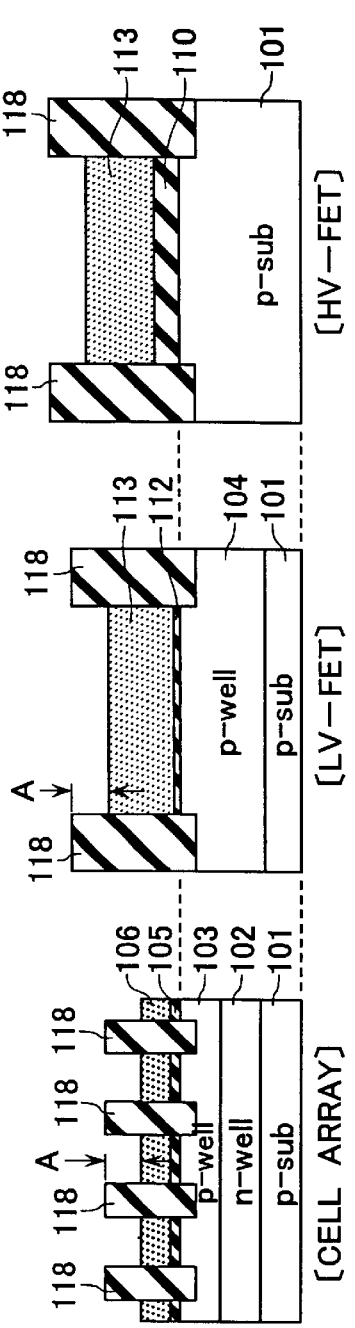
FIG. 32 is a sectional diagram showing a step of stopper film removal in the embodiment.

Next, deposit an element isolation oxide film 118 to a thickness of 300 nm, which is then subject to planarization processing by use of CMP techniques. The result of this planarisation is that the element isolation oxide film 118 is buried in trenches 117 as shown in FIG. 31. The silicon nitride films 107, 114 are expected to function as a stopper during this CMP process.

Next, remove by etching the silicon nitride films 107, 114 used as the stopper. Removal of these films results in a stair step-like surface level difference "A" being formed between the element isolation oxide film 118 and a gate electrode film of an element region as surrounded thereby. The step-like difference A is equivalent to a total thickness of the silicon nitride films 107, 114.

Figure 33:
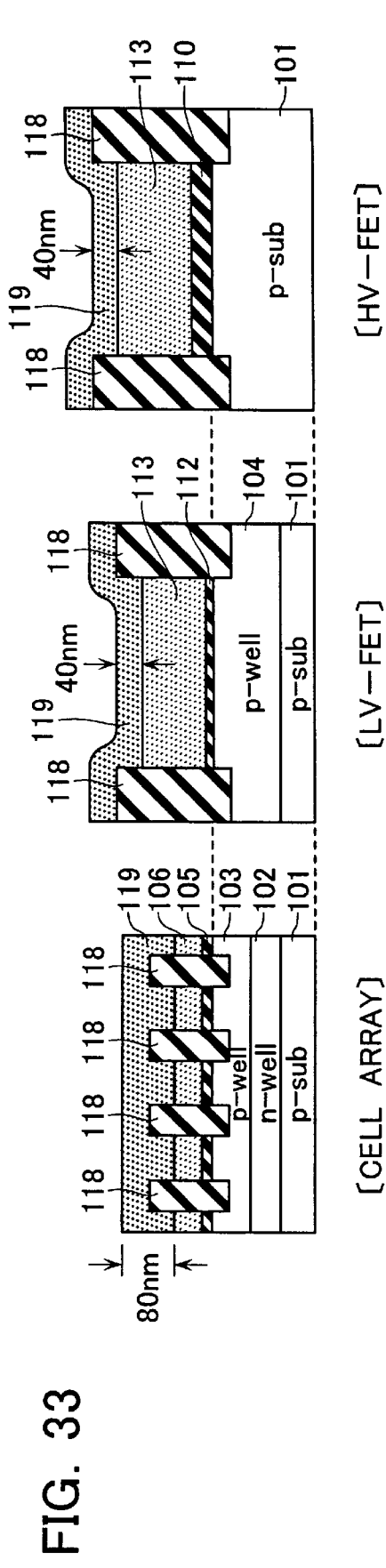
FIG. 33 is a sectional diagram showing a step of depositing a third polysilicon film in the embodiment.

Next as shown in FIG. 33, deposit a polysilicon film 119 to a thickness of 40 nm so that film 119 overlaps the polysilicon films 106, 113. In the cell array region with a layout of highly integrated memory transistors, the polysilicon film 119 tends to fill each recess between adjacent portions of the element isolation oxide film 118. On the contrary, in the peripheral circuit region in which transistors are disposed with an integration density lower than in the cell array region, such fulfillment (even fill) hardly occurs because of the significance of a distance or interval of neighboring element isolation film portions 118. Consequently, surface-recessed element formation regions of the cell array region are such that the polysilicon film 119 increases in thickness up to about 80 nm due to this even fill. In contrast, in each element formation region of the HV/LV-FET peripheral circuit regions, the polysilicon film 119 is about 40 nm in thickness due to uneven fill of poly-Si film 119.

Figure 34:
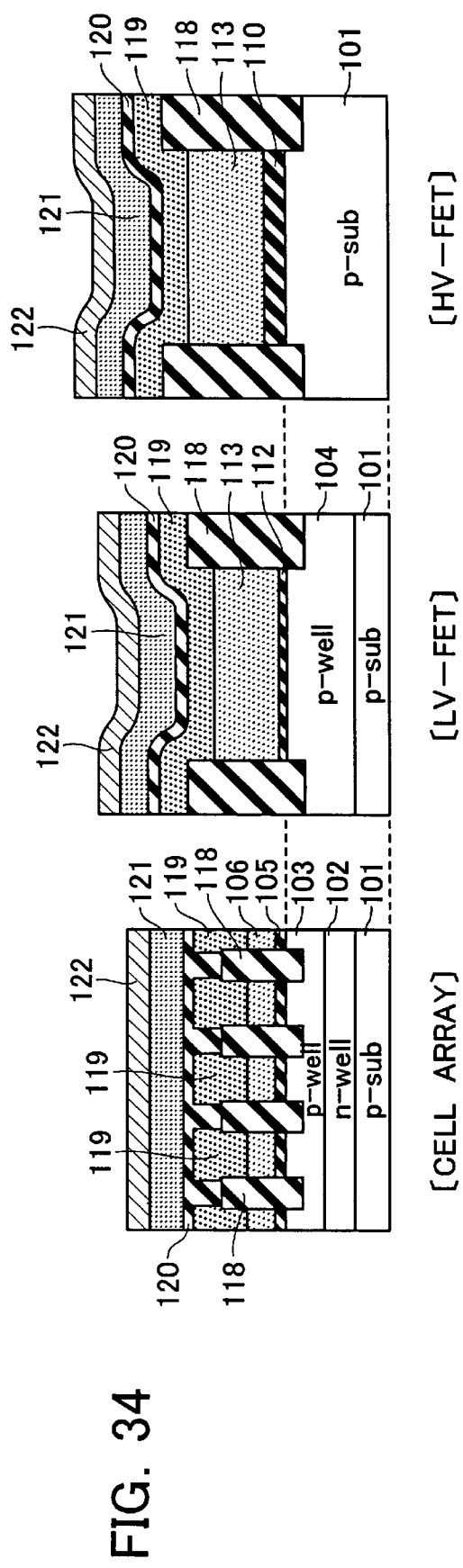
FIG. 34 is a sectional diagram showing a step of depositing an inter-gate dielectric film, a fourth polysilicon film and a WSi film in the embodiment.

Next as shown in FIG. 34, etch the polysilicon film 119 in the cell array region, thus forming slits for isolation between the floating gates of memory transistors. Thereafter, deposit a 20-nm thick ONO film 120 for use as a second gate dielectric film of each memory transistor. Further, form by known LPCVD methods a polysilicon film 121 of 40-nm thickness and a 30-nm thick WSi film 122. Whereby, gate electrode-forming film deposition is completed.

Figure 35:
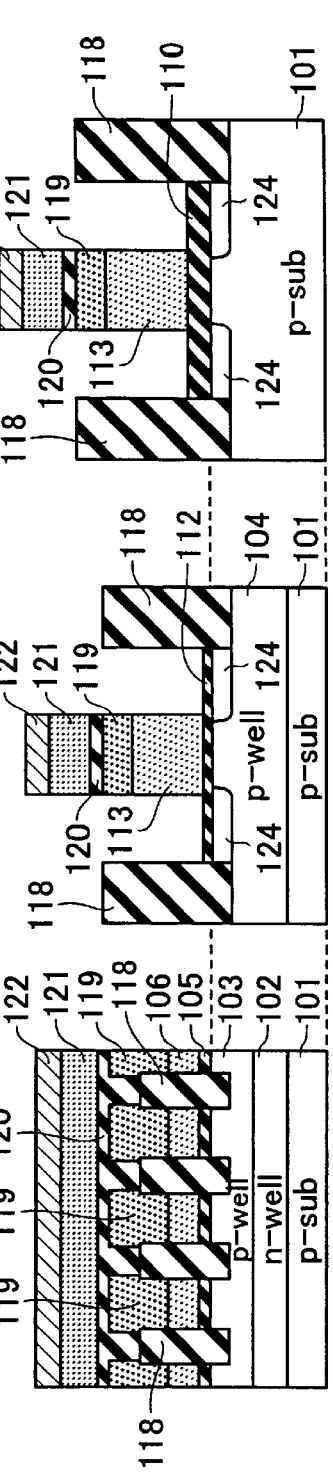
FIG. 35 is a sectional diagram showing a step of patterning the gate of each transistor in the embodiment.

Next as shown in FIG. 35, pattern the deposited films spanning from the WSi film 122 to polysilicon films 106, 113, forming the gate electrode of each transistor. Further, implant impurity ions to thereby form source/drain diffusion layers 124 in the substrate.

Figure 36:
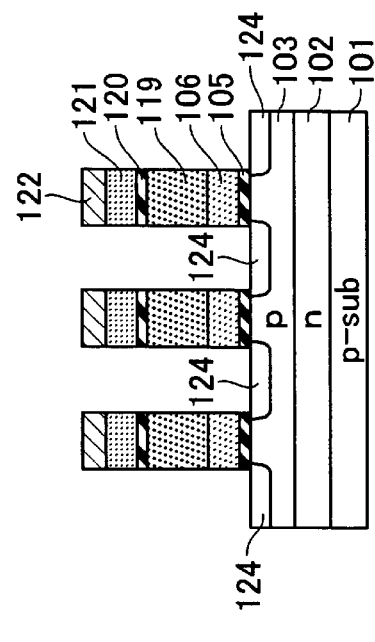
FIG. 36 is a diagram showing a different cross-sectional view of the cell array region of FIG. 35.

Although at the process up to here the cell array region is depicted in the form of a cross-section taken along word lines, a sectional view of the cell array region along a direction perpendicular thereto is as shown in FIG. 36. As shown herein, floating gates independent of each other on a per-memory transistor basis are each formed of a lamination or multilayer structure of the polysilicon films 106, 119, whereas word lines are formed each of which is made up of a multilayer of polysilicon film 121 and WSi film 122.

Thereafter, known methods are used to perform interlayer insulating film fabrication, contact hole formation and aluminum (Al) wiring pattern formation, thus completing the intended NAND-type flash memory.

With this embodiment, any etching residues and substrate over-etching no longer take place during the all-at-once patterning process of the gate electrodes in the cell array region and in the peripheral circuit region. This is as a result of employing a specific technique which follows: at the film deposition process step after the element isolation process, the polysilicon film 113 to be formed in the peripheral circuit region is thickened to become greater in thickness than the polysilicon film 106 being formed in the cell array region prior to element isolation, by taking into consideration the fulfillment in the cell array region with a dense transistor layout. More specifically, the polysilicon film 119 to be formed after completion of the element isolation process measures about 40 nm in thickness in the peripheral circuit region; however, it is about 80 nm thick due to the presence of a dense convexo-concave surface configuration in the cell array region. In prospect of this film thickness difference, let the polysilicon film 106 being formed in the cell array region prior thereto be set at about 40 nm in thickness while setting the polysilicon film 113 as formed in the peripheral circuit region be thicker than it and measure about 80 nm in thickness. The result of these settings is that during gate electrode patterning process, the cell array region and the peripheral circuit region are made substantially equal to each other in total polysilicon film thickness. With the above scheme, it is well guaranteed that no etch residues and no substrate overetching occur during gate electrode etch processing. In particular, it is possible to enhance the characteristics of LV-FETs using ultrathin gate oxide films.

Although in the above embodiment a specific example is shown wherein a first circuit region with highly integrated transistors formed therein is for use as the cell array whereas a second circuit region with transistors including HV-FETs and LV-FETs being formed at a lower integration density is the peripheral circuit region, similar results are obtainable by application of similar processes in cases where the first circuit region is a region with a layout of ordinary or standard transistors rather than the memory transistors and also in case the second circuit region is of layout of insulated-gate transistors having a single kind of gate dielectric film.

While the present invention has been particularly shown and described with respect to the illustrative embodiments thereof, it will be understood by those skilled in the art that various changes in form and details may be made therein without departing from the spirit, scope, and teachings of the invention.

What is claimed is:

1. A method of fabricating a semiconductor device having a cell array with a layout of non-volatile memory transistors and a peripheral circuit including a first transistor and a second transistor as driven by a lower voltage than said first transistor, comprising:

forming over a semiconductor substrate a first gate dielectric film for use in said first transistor;

selectively etching said first gate dielectric film in a region of said cell array to expose said semiconductor substrate;

forming over said semiconductor substrate thus exposed a second gate dielectric film for use as a tunnel dielectric film of said memory transistors, said second gate dielectric film being thinner than said first gate dielectric film;

forming a first gate electrode material film over said first and second gate dielectric films;

selectively etching said first gate electrode material film and said first gate dielectric film thereunder in a region of said second transistor to expose said semiconductor substrate;

forming over said semiconductor substrate thus exposed a third gate dielectric film for use in said second transistor, said third gate dielectric film being thinner than said second gate dielectric film;

forming a second gate electrode material film over said third gate dielectric film; and forming gates of said first and second transistors and of said memory transistors while letting said gates at least partly include said first and second gate electrode material films.

2. The method according to claim 1, further comprising:

forming, after formation of said second gate electrode material film, a groove to a prespecified depth of said semiconductor substrate from said second gate electrode material film;

burying in said groove an element isolating dielectric film; and forming over said first and second gate electrode material films a multilayer structure of a third gate electrode material film and an inter-gate dielectric film of said memory transistors plus a fourth gate electrode material film in this order of sequence, wherein said gates of said first and second transistors and said memory transistors are formed simultaneously by selective etching of said first to fourth gate electrode material films.

3. The method according to claim 2, further comprising:

performing ion implantation for threshold adjustment into the region of said cell array through said first gate dielectric film, with a resist mask formed for use during selective etching of said first gate dielectric film.

4. The method according to claim 2, further comprising:

performing ion implantation for threshold adjustment into the region of said second transistor through said first gate dielectric film with a resist mask formed for use during selective etching of said first gate electrode material film and said first gate dielectric film.

5. The method according to claim 2, further comprising:

after having selectively etched said first gate electrode material film and said first gate dielectric film and prior to formation of said third gate dielectric film, forming an insulative buffer film in the region of said second transistor and then performing, through this buffer film, ion implantation for threshold adjustment.

6. The method according to claim 2, wherein said second gate dielectric film is a thermally oxidized silicon oxide film.

7. The method according to claim 2, wherein said second gate dielectric film is a silicon oxynitride film obtainable by thermal processing of a silicon thermal oxide film in a nitride gaseous atmosphere.

8. The method according to claim 2, further comprising:

successively depositing a first stopper film after deposition of said first gate electrode material film; and successively depositing a second stopper film after deposition of said second gate electrode material film, wherein said groove is formed by performing etching to a prespecified depth of said semiconductor substrate from said first and second gate dielectric films with said first and second stopper films as a mask, and wherein said element isolating dielectric film is buried by depositing an insulative film for isolation use and then etching this film until said first and second stopper films are exposed.

9. A method of fabricating a semiconductor device having a cell array with a layout of nonvolatile memory transistors and a peripheral circuit including a first transistor and a second transistor as driven by a lower voltage than said first transistor, comprising:

forming a first gate dielectric film over a semiconductor substrate for use in said first transistor;

selectively etching said first gate dielectric film in a region of said second transistor to expose said semiconductor substrate;

forming over said semiconductor substrate thus exposed a second gate dielectric film for use in said second transistor, said second gate dielectric film being thinner than said first gate dielectric film;

forming a first gate electrode material film over the first and second gate dielectric films;

selectively etching in a region of said cell array said first gate electrode material film and said first gate dielectric film thereunder to expose said semiconductor substrate;

forming over said semiconductor substrate thus exposed a third gate dielectric film for use as a tunnel dielectric film of said memory transistors, said third gate dielectric film being thinner than said first gate dielectric film and thicker than said second gate dielectric film;

forming a second gate electrode material film over said third gate dielectric film; and forming gates of said first and second transistors and of said memory transistors while at least partially including said first and second gate electrode material films.

10. The method according to claim 9, further comprising:

forming, after formation of said second gate electrode material film, a groove to a prespecified depth of said semiconductor substrate from said second gate electrode material film;

burying in said groove an element isolating dielectric film; and forming on said first and second gate electrode material films a multilayer structure of a third gate electrode material film and an inter-gate dielectric film of said memory transistors plus a fourth gate electrode material film in this order of sequence, wherein said gates of said first and second transistors and said memory transistors are formed simultaneously by selective etching of said first to fourth gate electrode material films.

11. The method according to claim 10, further comprising:

performing ion implantation for threshold adjustment into the region of said second transistor through said first gate dielectric film, with a resist mask formed for use during selective etching of said first gate dielectric film.

12. The method according to claim 10, further comprising:

after having selectively etched said first gate dielectric film and prior to formation of said second gate dielectric film, forming an insulative buffer film in the region of said second transistor and then performing through this buffer film ion implantation for threshold adjustment.

13. The method according to claim 10, further comprising:
performing ion implantation for threshold adjustment into the region of said cell array through said first gate dielectric film with a resist mask formed for use during selective etching of said first gate electrode material film and said first gate dielectric film.

14. The method according to claim 10, wherein said second gate dielectric film is a thermally oxidized silicon oxide film.

15. The method according to claim 10, wherein said second gate dielectric film is a silicon oxynitride film obtainable by thermal processing of a silicon thermal oxide film in a nitride gaseous atmosphere.

16. A method of fabricating a semiconductor device having a first circuit and a second circuit with transistors disposed therein at a lower density than said first circuit, comprising:
forming in a region of said first circuit of a semiconductor substrate a first gate electrode material film covered with a first stopper film;
forming in a region of said second circuit of said semiconductor substrate a second gate electrode material film covered with a second stopper film, said second gate electrode material film being thicker than said first gate electrode material film;
forming more than one groove to a specified depth of said semiconductor substrate from said first and second stopper films, a groove interval in the region of said first circuit being less than that in the region of said second circuit region;
burying an element isolating dielectric film in said groove;
removing said first and second stopper films;
forming over said first and second gate electrode material films a third gate electrode material film in such a way that a total thickness of said first and third gate electrode material films in the region of said first circuit is substantially equal to a total thickness of said second and third gate electrode material films in the region of said second circuit; and
selectively etching said first to third gate electrode material films simultaneously to form gates of transistors of said first and second circuits.

17. The method according to claim 16, wherein said first circuit is a cell array with a layout of nonvolatile memory transistors, and wherein each said nonvolatile memory transistor has a tunnel dielectric film formed under said first gate electrode material film, a floating gate comprised of a multilayer structure of said first and third gate electrode material films as formed over said tunnel dielectric film, and a control gate comprised of a fourth gate electrode material film as formed over said floating gate with an intergate dielectric film interposed therebetween.

18. The method according to claim 16, wherein said second circuit has a first transistor with a first gate dielectric film formed under said second gate electrode material film and a second transistor with a second gate dielectric film being formed under said second gate electrode material film and being thinner than said first gate dielectric film, said second transistor being driven by a lower voltage than said first transistor.

19. The method according to claim 16, wherein said first and second gate electrode material films have a thickness difference substantially equal to a thickness of said first and second stopper films.

* * * * *